(12) United States Patent
Kim et al.

(10) Patent No.: US 10,553,606 B2
(45) Date of Patent: Feb. 4, 2020

(54) VERTICAL-TYPE MEMORY DEVICE

(71) Applicant: SAMSUNG ELECTRONICS CO., LTD., Suwon-si, Gyeonggi-do (KR)

(72) Inventors: Jong Won Kim, Hwaseong-si (KR); Hyun Goo Jun, Hwaseong-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/938,101

(22) Filed: Mar. 28, 2018

(65) Prior Publication Data
US 2019/0035804 A1    Jan. 31, 2019

(30) Foreign Application Priority Data

Jul. 27, 2017 (KR) .................. 10-2017-0095397

(51) Int. Cl.
| H01L 27/11582 | (2017.01) |
| H01L 27/1157 | (2017.01) |
| H01L 23/522 | (2006.01) |
| H01L 23/528 | (2006.01) |
| H01L 27/11565 | (2017.01) |

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11565* (2013.01)

(58) Field of Classification Search
CPC ......... H01L 27/11582; H01L 27/11565; H01L 27/1157; H01L 23/528; H01L 23/5226
USPC ............... 257/326, 324, 329, 368, 379, 390, 257/E27.06, E27.081, E27.103, E29.262, 257/E21.585, E21.645; 438/639, 667, 438/197
See application file for complete search history.

(56) References Cited

U.S. PATENT DOCUMENTS

| 9,373,635 | B2 | 6/2016 | Jung et al. |
| 9,449,987 | B1 | 9/2016 | Miyata et al. |
| 9,478,561 | B2 | 10/2016 | Kim et al. |
| 9,530,790 | B1* | 12/2016 | Lu ..................... H01L 27/11582 |
| 9,536,897 | B2* | 1/2017 | Yoo ................... H01L 27/11582 |
| 9,576,967 | B1 | 2/2017 | Kimura et al. |
| 9,978,766 | B1* | 5/2018 | Hosoda ............ H01L 27/11556 |

(Continued)

OTHER PUBLICATIONS

Search Report and Written Opinion dated Dec. 4, 2018, corresponding to Singapore Application No. 10201805010V, by the Singapore Intellectual Property Office.

*Primary Examiner* — Dao H Nguyen
(74) *Attorney, Agent, or Firm* — Lee & Morse, P.C.

(57) ABSTRACT

A vertical-type memory device and a manufacturing method thereof, the device including a substrate having a cell array region and a connection region; gate electrode layers stacked on the cell array region and the connection region of the substrate, the gate electrode layers forming a stepped structure in the connection region; a cell channel layer in the cell array region, the cell channel layer passing through the plurality of gate electrode layers; a dummy channel layer in the connection region, the dummy channel layer passing through at least one gate electrode layer of the plurality of gate electrode layers; a cell epitaxial layer disposed below the cell channel layer; and a dummy epitaxial layer disposed below the dummy channel layer, wherein the dummy epitaxial layer has a shape that is different from a shape of the cell epitaxial layer.

20 Claims, 19 Drawing Sheets

(56) References Cited

U.S. PATENT DOCUMENTS

| | | |
|---|---|---|
| 10,083,982 B2* | 9/2018 | Shigemura ........ H01L 21/28008 |
| 2015/0104916 A1 | 4/2015 | Lee et al. |
| 2016/0056169 A1 | 2/2016 | Lee et al. |
| 2016/0225785 A1* | 8/2016 | Kim .................. H01L 27/11575 |
| 2016/0307632 A1 | 10/2016 | Lee et al. |
| 2016/0329101 A1 | 11/2016 | Sakakibara |
| 2017/0025421 A1 | 1/2017 | Sakakibara et al. |
| 2017/0040337 A1 | 2/2017 | Kim et al. |
| 2017/0103997 A1 | 4/2017 | Lee et al. |
| 2017/0110543 A1 | 4/2017 | Shin et al. |

\* cited by examiner

VERTICAL-TYPE MEMORY DEVICE

CROSS-REFERENCE TO RELATED APPLICATION

Korean Patent Application No. 10-2017-0095397 filed on Jul. 27, 2017 in the Korean Intellectual Property Office, and entitled: "Vertical-Type Memory Device," is incorporated by reference herein in its entirety.

BACKGROUND

1. Field

Embodiments relate to a vertical-type memory device.

2. Description of the Related Art

Electronic products may perform high-capacity data processing while becoming ever smaller in volume. Increasing a degree of integration of semiconductor memory devices used in such electronic products may be desirable. As a method for improving the degree of integration of a semiconductor memory device, a vertical-type memory device in which memory cells having a vertical transistor structure, instead of a planar transistor structure, are stacked, has been considered.

SUMMARY

The embodiments may be realized by providing a vertical-type memory device including a substrate having a cell array region and a connection region adjacent to the cell array region; a plurality of gate electrode layers stacked on the cell array region and the connection region of the substrate, the plurality of gate electrode layers forming a stepped structure in the connection region; a cell channel layer in the cell array region, the cell channel layer passing through the plurality of gate electrode layers; at least one dummy channel layer in the connection region, the at least one dummy channel layer passing through at least one gate electrode layer of the plurality of gate electrode layers; a cell epitaxial layer disposed below the cell channel layer; and at least one dummy epitaxial layer disposed below the at least one dummy channel layer, wherein the at least one dummy epitaxial layer has a shape that is different from a shape of the cell epitaxial layer.

The embodiments may be realized by providing a vertical-type memory device including a substrate having a cell array region and a connection region located outside the cell array region; a plurality of gate electrode layers stacked on the cell array region and the connection region of the substrate, the plurality of gate electrode layers forming a stepped structure in the connection region; a dummy channel layer disposed in the connection region, the dummy channel layer passing through the plurality of gate electrode layers; and a dummy epitaxial layer disposed below the dummy channel layer, wherein the dummy epitaxial layer includes an upper region and a lower region spaced apart from each other with an insulating material therebetween.

The embodiments may be realized by providing a vertical-type memory device including a substrate; a plurality of gate electrode layers stacked on the substrate; a dummy channel hole passing through at least one among the plurality of gate electrode layers; a gate dielectric layer in the dummy channel hole; an upper dummy epitaxial layer in contact with a lower surface of the gate dielectric layer; and a lower dummy epitaxial layer spaced apart from the upper dummy epitaxial layer.

The embodiments may be realized by providing a method of manufacturing a vertical-type memory device, the method including preparing a substrate having a cell array region and a connection region; alternately stacking mold insulation layers and sacrificial layers on the substrate; forming cell channel holes and dummy channel holes passing through the mold insulation layers and the sacrificial layers, respectively, in the cell array region and the connection region; forming cell epitaxial layers and dummy epitaxial layers in a lower portion of the cell channel holes and in a lower portion of the dummy channel holes, respectively, using a selective epitaxial growth process; selectively injecting carbon ions into the cell epitaxial layers; forming gate dielectric layers covering side walls of the cell channel holes and side walls of the dummy channel holes; and forming first recesses and second recesses in an upper portion of the cell epitaxial layers and in an upper portion of the dummy epitaxial layers, respectively.

The embodiments may be realized by providing a method of manufacturing a vertical-type memory device, the method including preparing a substrate having a cell array region and a connection region; alternately stacking mold insulation layers and sacrificial layers on the substrate; forming cell channel holes and dummy channel holes passing through the mold insulation layers and the sacrificial layers, respectively, in the cell array region and the connection region, a diameter of dummy channel holes being greater than a diameter of the cell channel holes; forming cell epitaxial layers and dummy epitaxial layers in a lower portion of the cell channel holes and in a lower portion of the dummy channel holes, respectively, using a selective epitaxial growth process; forming gate dielectric layers covering side walls of the cell channel holes and side walls of the dummy channel holes; injecting carbon ions into the cell epitaxial layers and the dummy epitaxial layers; and forming first recesses and second recesses in an upper portion of the cell epitaxial layers and in an upper portion of the dummy epitaxial layers, respectively.

BRIEF DESCRIPTION OF DRAWINGS

Features will be apparent to those of skill in the art by describing in detail exemplary embodiments with reference to the attached drawings in which.

DETAILED DESCRIPTION

Figure 1:
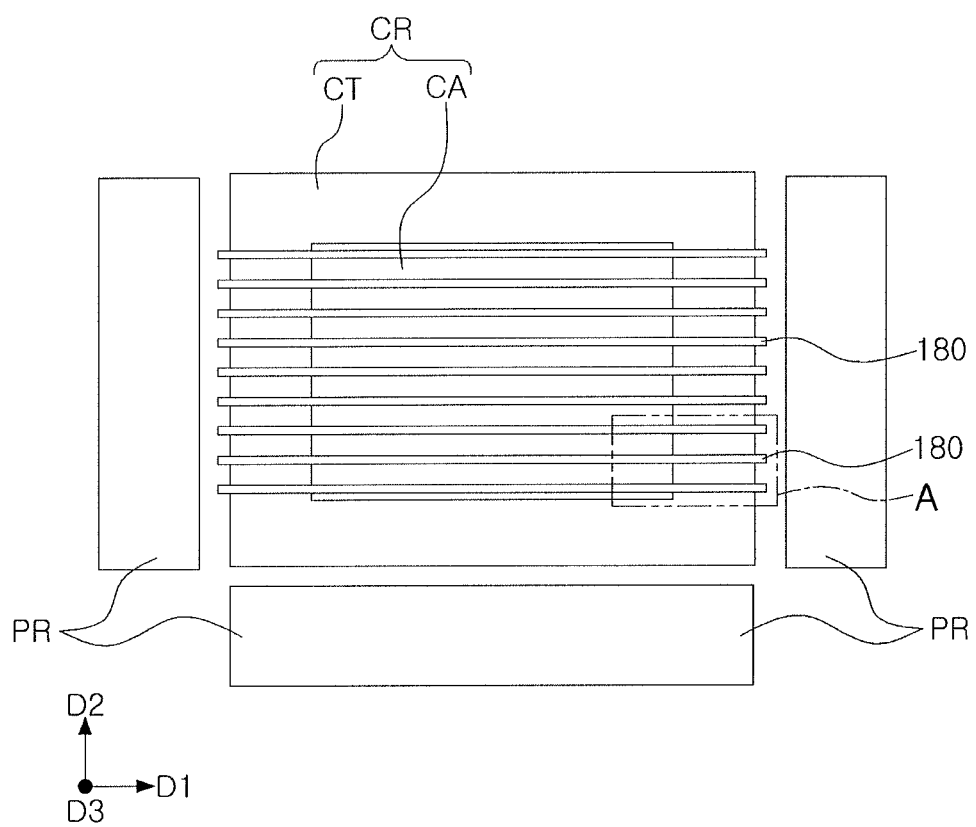
FIG. 1 illustrates a schematic layout view of a vertical-type memory device according to an example embodiment.

FIG. 1 illustrates a schematic conceptual view of a vertical-type memory device according to an example embodiment.

With reference to FIG. 1, a vertical-type memory device according to an example embodiment may include a cell region CR (in which a plurality of memory cells are formed) and a peripheral circuit region PR (in which peripheral circuits for driving memory cells are formed). In the peripheral circuit region PR, a row decoder circuit, a column decoder circuit, a page buffer circuit, or the like may be included. In an implementation, the peripheral circuit region PR may have a suitable arrangement.

A plurality of common source lines 180, extending in a first direction D1, may be included in the cell region CR. The common source lines 180 may be referred to as first metal lines. The plurality of common source lines 180 may be disposed at (e.g., spaced apart from one another at) predetermined intervals in a second direction D2 intersecting the first direction D1. The cell region CR may be divided into a plurality of regions by the common source lines 180. The cell region CR may include a cell array region CA and a connection region CT surrounding the cell array region CA. The plurality of common source lines 180 may extend in the first direction D1 to be integrally formed with the cell array region CA and the connection region CT. In an implementation, a suitable number of the common source lines 180 may be included.

Figure 2:
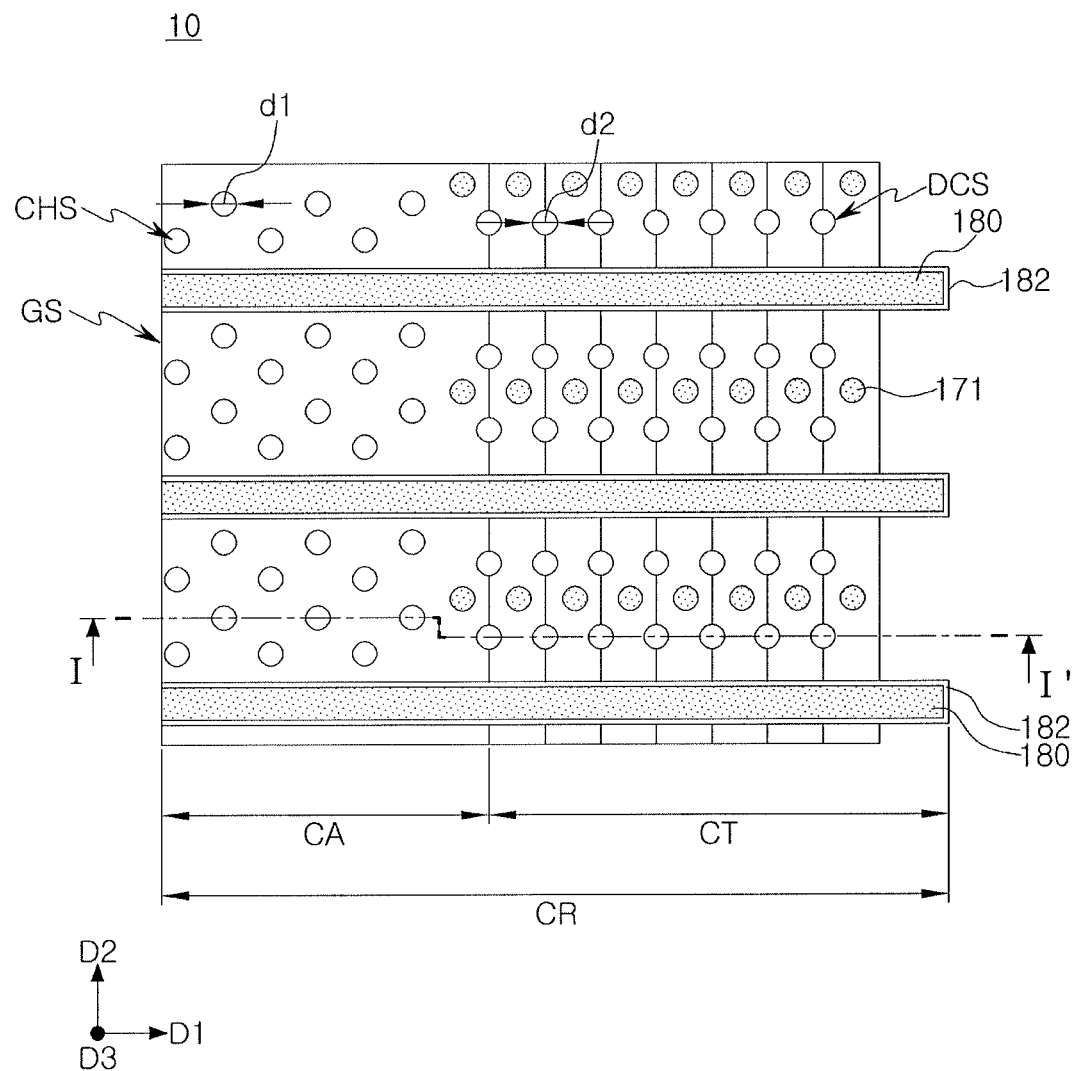
FIG. 2 illustrates a schematic plan view of a vertical-type memory device according to an example embodiment.

FIG. 2 illustrates a schematic plan view of a vertical-type memory device 10 according to an example embodiment. FIG. 2 illustrates region A of FIG. 1.

With reference to FIG. 2, the vertical-type memory device 10 may include the cell array region CA (in which memory cells are formed) and the connection region CT (for connecting gate electrodes of the memory cells to wires). The cell array region CA and the connection region CT may form the cell region CR together.

A stacked structure GS extending in the first direction D1 may be disposed in the cell array region CA and the connection region CT. The stacked structure GS may include a plurality of gate electrode layers and a plurality of mold insulation layers alternately stacked on a substrate. The stacked structure GS may be divided into a plurality of regions by the plurality of common source lines 180. The plurality of common source lines 180 may continuously extend in the first direction D1 in the cell array region CA and the connection region CT. The plurality of common source lines 180 may be electrically connected to the substrate. The plurality of common source lines 180 may be formed of a conductive material. For example, the plurality of common source lines 180 may include a metal such as tungsten, copper, titanium, aluminum, or the like, a doped semiconductor material, a conductive material such as a conductive metal nitride film, or the like. The plurality of common source lines 180 may be electrically insulated from gate electrode layers of the stacked structure GS. An insulating layer 182 may be disposed between the plurality of common source lines 180 and the stacked structure GS. The insulating layer 182 may include, e.g., silicon oxide ($SiO_2$), silicon nitride (Si3N4), silicon oxynitride (SiON), or combinations thereof.

At least one channel structure CHS, e.g., a plurality of channel structures CHS, (passing through the stacked structure GS to be connected to the substrate) may be disposed in the cell array region CA, and at least one dummy channel structure DCS, e.g., a plurality of dummy channel structures DCS, (passing through the stacked structure GS to be connected to the substrate) and a plurality of contact plugs 171 (connected to the plurality of gate electrode layers) may be disposed in the connection region CT.

In the cell array region CA, the plurality of channel structures CHS may be disposed in a plurality of rows. In an implementation, as illustrated in FIG. 2, channel structures CHS may be disposed in, e.g., four rows between a pair of common source lines 180. In an implementation, the plurality of channel structures CHS may be disposed in a zigzag form. In an implementation, the arrangement of the plurality of channel structures CHS may be variously or suitably modified.

The stacked structure GS may form a stepped structure including a plurality of step layers in the connection region CT. For example, the plurality of gate electrode layers and the plurality of mold insulation layers of the stacked structure GS may extend different lengths, thereby forming the stepped structure. The plurality of step layers may be provided as pad regions in which the plurality of contact plugs 171 are disposed.

The plurality of dummy channel structures DCS may be adjacent to an end of respective ones of the plurality of step layers. In an implementation, the plurality of dummy channel structures DCS may be disposed in, e.g., two rows between a pair of common source lines 180, as illustrated in FIG. 2. In an implementation, a portion of the plurality of dummy channel structures DCS may be disposed to be adjacent to an end of the plurality of step layers, and the remaining portion may be disposed to be spaced apart from the end of the plurality of step layers. In an implementation, the plurality of dummy channel structures DCS may be spaced apart from an end of the plurality of step layers to be disposed in the plurality of step layers.

The plurality of channel structures CHS may be connected to a bit line for read/write operations, and the plurality of dummy channel structures DCS may not be connected to the bit line. Thus, the plurality of dummy channel structures DCS may not provide memory cells, and may serve to support the stacked structure GS in the connection region CT.

A diameter d1 of, e.g., each of, the plurality of channel structures CHS may be the same as a diameter d2 of, e.g., each of, the plurality of dummy channel structures DCS.

Figure 3:
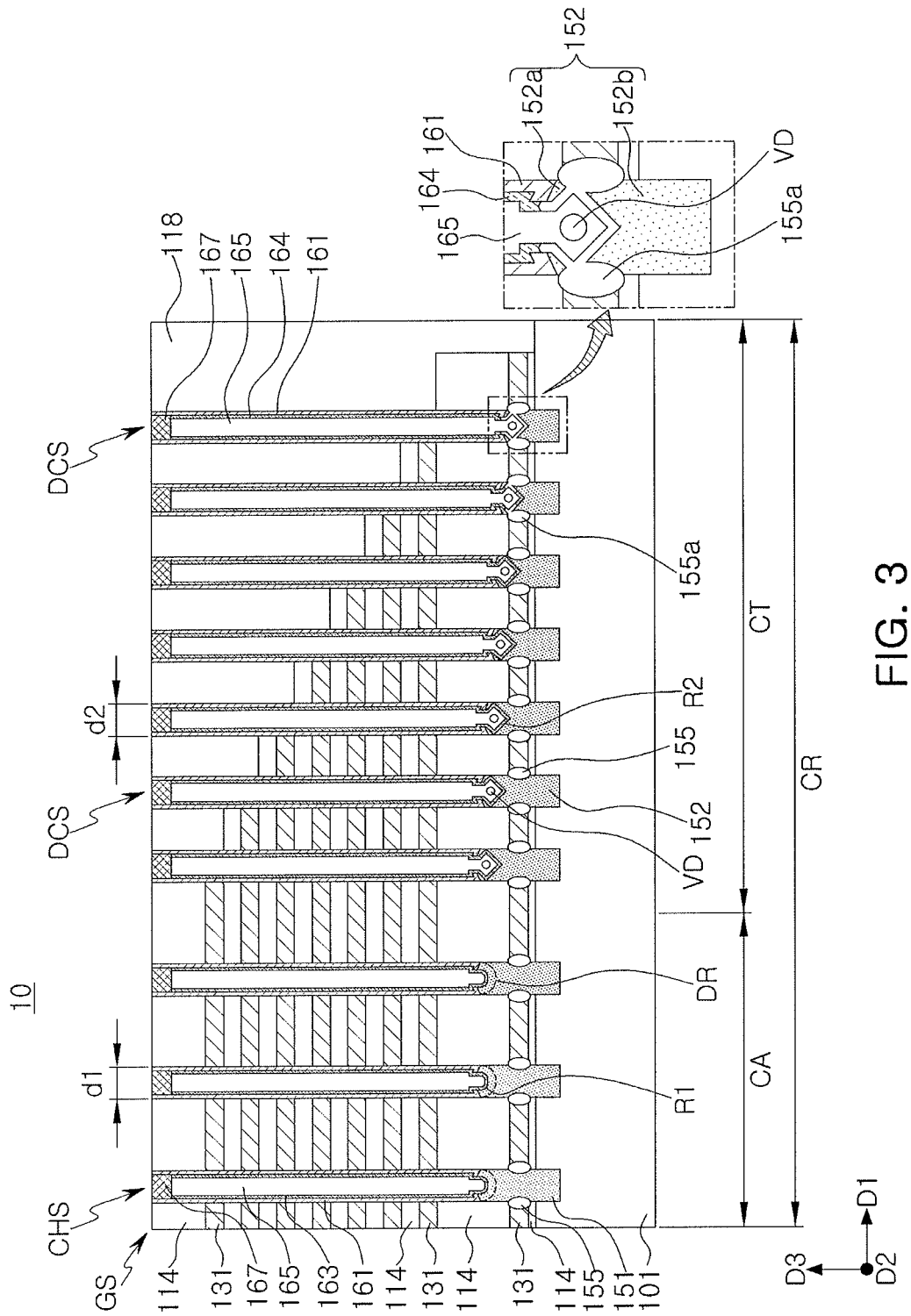
FIG. 3 illustrates a schematic cross-sectional view of a vertical-type memory device according to an example embodiment.

FIG. 3 illustrates a schematic cross-sectional view of the vertical-type memory device 10 according to an example embodiment. FIG. 3 illustrates a cross-sectional view taken along line I-I' of FIG. 2.

With reference to FIGS. 2 and 3, the vertical-type memory device 10 may include the substrate 101, the stacked structure GS, the channel structures CHS, the dummy channel structures DCS, and the like.

The substrate 101 may include a semiconductor material, e.g., a Group IV semiconductor, a Group III-V compound semiconductor, or a Group II-VI compound semiconductor. The stacked structure GS may include the plurality of gate electrode layers 131 and the plurality of mold insulation layers 114, alternately stacked on the substrate 101. The plurality of gate electrode layers 131 may be spaced apart from each other in a third direction D3, perpendicular to an upper surface of the substrate 101, to be stacked on the substrate 101. The plurality of gate electrode layers 131 may extend in the first direction D1 and may be disposed in the cell array region CA and the connection region CT. The stacked structure GS may have a stepped structure including a plurality of step layers in the connection region CT. For example, each gate electrode layer 131 of the plurality of gate electrode layers 131 may extend a different length in the first direction D1 to form the stepped structure in the connection region CT. The mold insulation layers 114 may form the stepped structure with the gate electrode layers 131.

The gate electrode layers 131 and the mold insulation layers 114 may form the stacked structure GS. The gate electrode layers 131 may include, e.g., a metal material, metal nitride, a metal silicide material, polycrystalline silicon, or combinations thereof. The metal material may include, e.g., tungsten (W), copper (Cu), or aluminum (Al). The metal silicide may include, e.g., a silicide material of cobalt (Co), nickel (Ni), hafnium (Hf), platinum (Pt), tungsten (W) and titanium (Ti), or combinations thereof. The metal nitride may include, e.g., tungsten nitride (WN), tantalum nitride (TaN), titanium nitride (TiN), or combinations thereof. The mold insulation layers 114 may include, e.g., silicon oxide.

The device may include a suitable number of gate electrode layers 131. In an implementation, as storage capacity of the vertical-type memory device 10 is increased, the number of the gate electrode layers 131 forming memory cells may be increased. In an implementation, several tens to several hundreds of gate electrode layers 131 may be stacked on the substrate 101.

The vertical-type memory device may include an interlayer insulating layer 118 covering the stepped structure of the stacked structure GS, and disposed on the connection region CT. The interlayer insulating layers 118 may include, e.g., a silicon oxide or a low dielectric material. The low dielectric material may be an insulating material having a dielectric constant lower than that of silicon oxide.

The plurality of channel structures CHS passing through the plurality of gate electrode layers 131 may be disposed in the cell array region CA. The plurality of dummy channel structures DCS passing through at least one among the plurality of gate electrode layers 131 may be disposed in the connection region CT.

Each of the plurality of channel structures CHS disposed in the cell array region CA may include, e.g., a cell epitaxial layer 151, a gate dielectric layer 161, a cell channel layer 163, an insulating layer 165, and a contact pad 167. The plurality of dummy channel structures DCS may have a similar structure to the plurality of channel structures CHS. Each of the plurality of dummy channel structures DCS may include, e.g., a dummy epitaxial layer 152, a gate dielectric layer 161, a dummy channel layer 164, an insulating layer 165, and a contact pad 167. The cell epitaxial layer 151 may be referred to as a cell semiconductor pattern, and the dummy epitaxial layer 152 may be referred to as a dummy semiconductor pattern.

Insulating layers 155 (e.g., first insulating layers 155) may be locally disposed between cell epitaxial layers 151 and a gate electrode layer 131 located in a lowermost portion (e.g., the gate electrode layer 131 closest to the substrate 101). The insulating layers 155 may be disposed on a side wall of the cell epitaxial layers 151. The insulating layers 155 or insulating layers 155a (e.g., second insulating layers 155a) may be locally disposed between dummy epitaxial layers 152 and the gate electrode layer 131 located in a lowermost portion. The insulating layers 155a may be disposed on a side wall of a portion of the dummy epitaxial layers 152 adjacent to an edge (e.g., outer edge) of the connection region CT (e.g., distal to the cell array region CA). In addition, the insulating layers 155 may be disposed on a side wall of a portion of the dummy epitaxial layers 152 close or proximate to the cell array region CA. The edge (e.g., outer edge) of the connection region CT may refer to a region located away from (e.g., distal to) the cell array region CA. The insulating layers 155a may have a different shape from the insulating layers 155. The insulating layers 155 may have a ring shape surrounding the side wall of the cell epitaxial layers 151, and the insulating layers 155a may include a first portion having a ring shape surrounding the side wall of the dummy epitaxial layers 152, and a second portion protruding from the first portion.

The cell epitaxial layers 151 may be disposed below the cell channel layers 163 (e.g., the cell epitaxial layers 151 may be between the cell channel layers 163 and the substrate 101). The dummy epitaxial layers 152 may be disposed below the dummy channel layers 164 (e.g., the dummy epitaxial layers 152 may be between the dummy channel layers 164 and the substrate 101). A height of each of the cell epitaxial layers 151 may be the same in the cell array region CA. A height of each of the dummy epitaxial layers 152 of the plurality of dummy channel structures DCS may be different from one another in the connection region CT. For example, a height of the dummy epitaxial layers 152 of the plurality of dummy channel structures DCS may be reduced toward an edge of the connection region CT (e.g., heights of the dummy epitaxial layers 152 may become smaller in a direction from a portion of the connection region CT proximate to the cell array region CA toward the outer edge of the connection region CT). Thus, a vertical length (e.g., height) of the gate dielectric layers 161 of the plurality of dummy structures DCS, and the insulating layers 165 may increase toward an edge of the connection region CT. The vertical length may refer to a length in a direction perpendicular to an upper surface of the substrate 101 (e.g., the third direction D3).

The dummy epitaxial layers 152 may have a different shape from the cell epitaxial layers 151. For example, first recesses R1 may be formed in an upper portion of the cell epitaxial layers 151, and second recesses R2 may be formed in an upper portion of the dummy epitaxial layers 152. The first recesses R1 may have a downwardly concave shape. Carbon impurity regions DR may be disposed below (e.g., adjacent to) the first recesses R1 of the cell epitaxial layers 151. The second recesses R2 may include inclined surfaces extending below the gate dielectric layer 161. The inclined surfaces may extend to a side wall of the dummy epitaxial layers 152. Thus, the dummy epitaxial layer 152 may be divided into an upper region 152a (e.g., distal to the substrate 101) and a lower region 152b (e.g., proximate to the substrate 101).

The dummy epitaxial layer 152 of the dummy channel structure DCS may have the upper region 152a and the lower region 152b, having different shapes. The upper region 152a may be referred to as an upper dummy epitaxial layer, and the lower region 152b may be referred to as a lower dummy epitaxial layer. The upper region 152a of the dummy epitaxial layer 152 may be in contact with a lower surface of the gate dielectric layer 161. The upper region 152a of the dummy epitaxial layer 152 may have a ring shape. A thickness of the upper region 152a of the dummy epitaxial layer 152 may be changed in a direction away from the center (e.g., of the ring). For example, the thickness of the upper region 152a of the dummy epitaxial layer 152 may increase in the direction away from the center. The lower region 152b of the dummy epitaxial layer 152 may be columnar, and an upper surface of the lower region 152b of the dummy epitaxial layer 152 may have inclined surfaces. The inclined surfaces and the side wall of the dummy epitaxial layer 152 may be at or form an acute angle.

In the case of the dummy epitaxial layer 152 at an edge of the connection region CT, the upper region 152a and the lower region 152b may be separated from each other by an insulating material. The insulating material may include the insulating layer 165 and the insulating layer 155a. The cell epitaxial layers 151 may be in contact with the cell channel layer 163, and the lower region 152b of the dummy epitaxial layer 152 at the edge of the connection region CT may be spaced apart from the dummy channel layer 164. Thus, the cell channel layers 163 may be electrically connected to the substrate 101 through the cell epitaxial layer 151, and the dummy channel layer 164 of the dummy channel structure DCS at the edge of the connection region CT may be electrically insulated from the substrate 101. In addition, the dummy epitaxial layer 152 at the edge of the connection region CT may be electrically insulated from the gate electrode layer 131 located in a lowermost portion. Thus, leakage current flowing through the dummy channel structure DCS may be blocked in the connection region CT to obtain the vertical-type memory device 10 having excellent electrical characteristics.

In an implementation, the thickness of the upper region 152a of the dummy epitaxial layer 152 disposed at the edge of the connection region CT may be changed in a direction away from the center. For example, the thickness of the upper region 152a of the dummy epitaxial layer 152 at the edge of the connection region CT may first increase in the direction away from the center, and then may decrease. The lower region 152b at the edge of the connection region CT may include a ring-shaped protrusion portion. The protrusion portion may have a pointed end portion having a point that forms an acute angle.

The cell epitaxial layers 151 and the dummy epitaxial layers 152 may be formed using a selective epitaxial growth. The cell epitaxial layers 151 and the dummy epitaxial layers 152 may include a semiconductor material, e.g., monocrystalline silicon or the like.

The cell channel layers 163 may be vertically extended (e.g., may extend in the third direction D3) while passing through the mold insulation layers 114 and the gate electrode layers 131, and may cover a surface of the first recesses R1 of the cell epitaxial layers 151. The dummy channel layers 164 may be vertically extended while passing through the mold insulation layers 114 and the gate electrode layers 131, and may cover a surface of the second recesses R2 of the dummy epitaxial layers 152. In an implementation, the dummy channel layer 164 may not be present on a surface of a second recess R2 at the edge of the connection region CT, or the dummy channel layer 164 may be disposed only on a portion of the surface thereof.

The gate dielectric layers 161 may surround an outer side of the cell channel layers 163. The gate dielectric layer 161 may include a tunneling layer, a charge storage layer, and a blocking layer, sequentially disposed from an outer side of the cell channel layer 163. The gate dielectric layers 161 may surround an outer side of the dummy channel layers 164. In the connection region CT, voids VD may be disposed below the gate dielectric layers 161 and between the upper region 152a and the lower region 152b of the dummy epitaxial layers 152. Positions of the voids VD may be lowered toward an edge of the connection region CT (e.g., a distance from the void VD to the substrate 101 may be smaller in a direction from a region of the connection region CT adjacent or proximate to the cell array region CA toward the edge of the connection region CT). The voids VD may be sealed by an insulating material. The insulating material may include the insulating layer 165.

The gate dielectric layer 161 may include a tunneling layer, a charge storage layer, and a blocking layer, sequentially disposed from an outer side of the dummy channel layer 164. The tunneling layer may include, e.g., silicon oxide. The charge storage layer may include, e.g., silicon nitride. The blocking layer may include silicon oxide ($SiO_2$), silicon nitride ($Si_3N_4$), silicon oxynitride (SiON) or a high-k dielectric material. The high-k dielectric material may be one among aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), and praseodymium oxide ($Pr_2O_3$).

The cell channel layers 163 and the dummy channel layers 164 may have an empty internal space. An internal space of the cell channel layers 163 and an internal space of the dummy channel layers 164 may be filled with the insulating layers 165. The cell channel layers 163 and the dummy channel layers 164 may include a semiconductor material, e.g., polycrystalline silicon, monocrystalline silicon, or the like. The insulating layers 165 may be disposed in the first recesses R1 of the cell epitaxial layers 151 and in the second recesses R2 of the dummy epitaxial layers 152. The insulating layers 165 may include, e.g., an insulating material, such as silicon oxide, or the like.

Contact pads 167 may be disposed on the cell channel layers 163 and the dummy channel layers 164, and may be in contact with the cell channel layers 163 and the dummy channel layers 164. The contact pads 167 may include, e.g., a semiconductor material, such as polycrystalline silicon, or the like.

FIGS. 4 through 10 illustrate stage in a method of manufacturing the vertical-type memory device 10 according to an example embodiment. In FIGS. 4 through 10, regions corresponding to FIG. 3 are illustrated.

Figure 4:
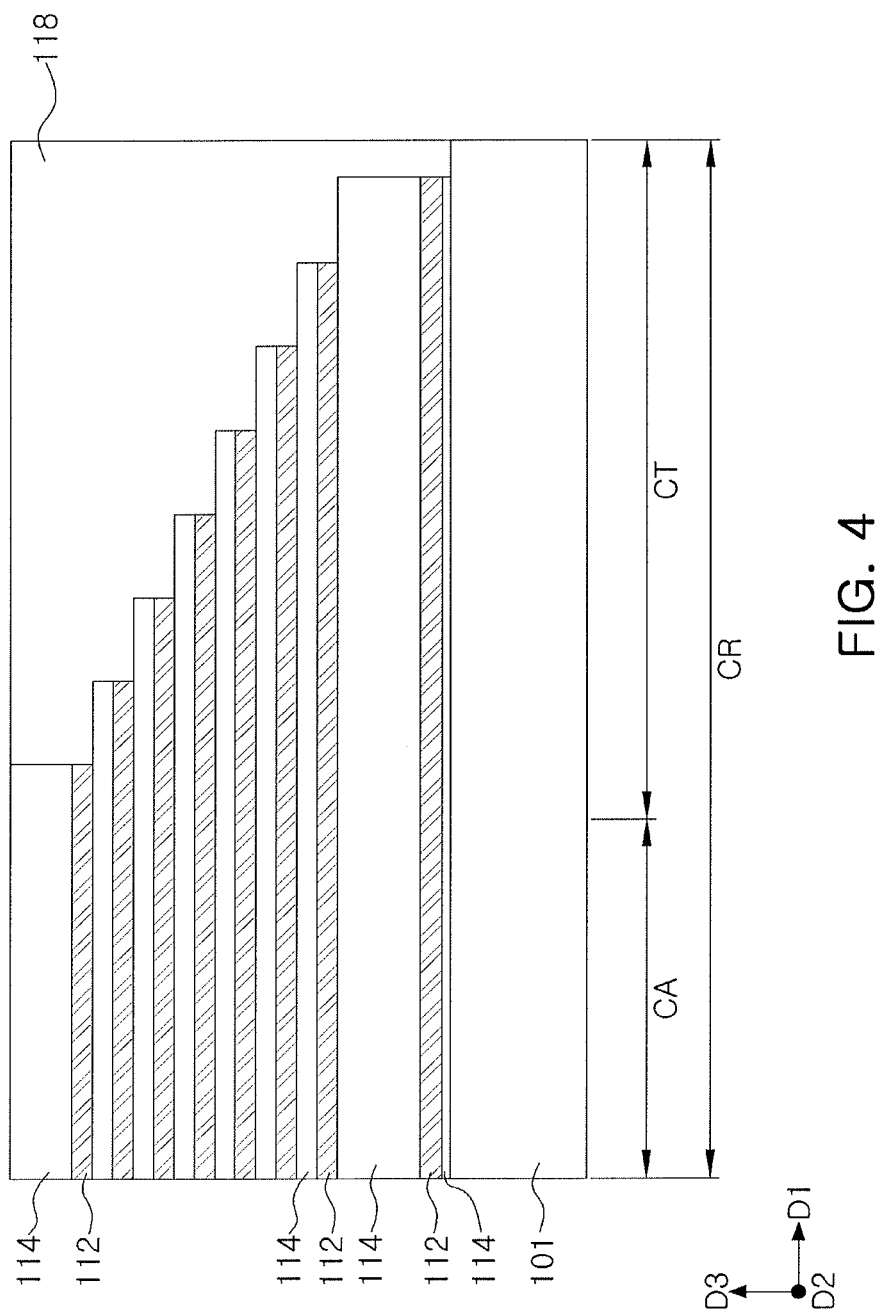
FIGS. 4 through 10 illustrate sectional views of stages in a method of manufacturing a vertical-type memory device according to an example embodiment.

With reference to FIG. 4, sacrificial layers 112 and mold insulation layers 114 may be alternately stacked on a substrate 101.

After the mold insulation layer 114 is formed on a surface of the substrate 101 first, the sacrificial layers 112 and the mold insulation layers 114 may alternately be formed. A portion among the mold insulation layers 114 may have a different thickness. The number of the mold insulation layers 114 and the number of the sacrificial layers 112 may be variously changed. The sacrificial layers 112 and the mold insulation layers 114 may extend different lengths in the connection region CT. The sacrificial layers 112 and the mold insulation layers 114 may form a stepped structure in the connection region CT.

The sacrificial layers 112 may be formed of a material having an etch selectivity with respect to the mold insulation layers 114. For example, the mold insulation layers 114 may be formed of at least one of silicon oxide and silicon nitride, and the sacrificial layers 112 may be formed of silicon, silicon oxide, silicon carbide, or silicon nitride, and may be formed of a different material from the mold insulation layers 114.

Next, the interlayer insulating layer 118, covering the sacrificial layers 112 and the mold insulation layers 114, may be formed.

Figure 5:
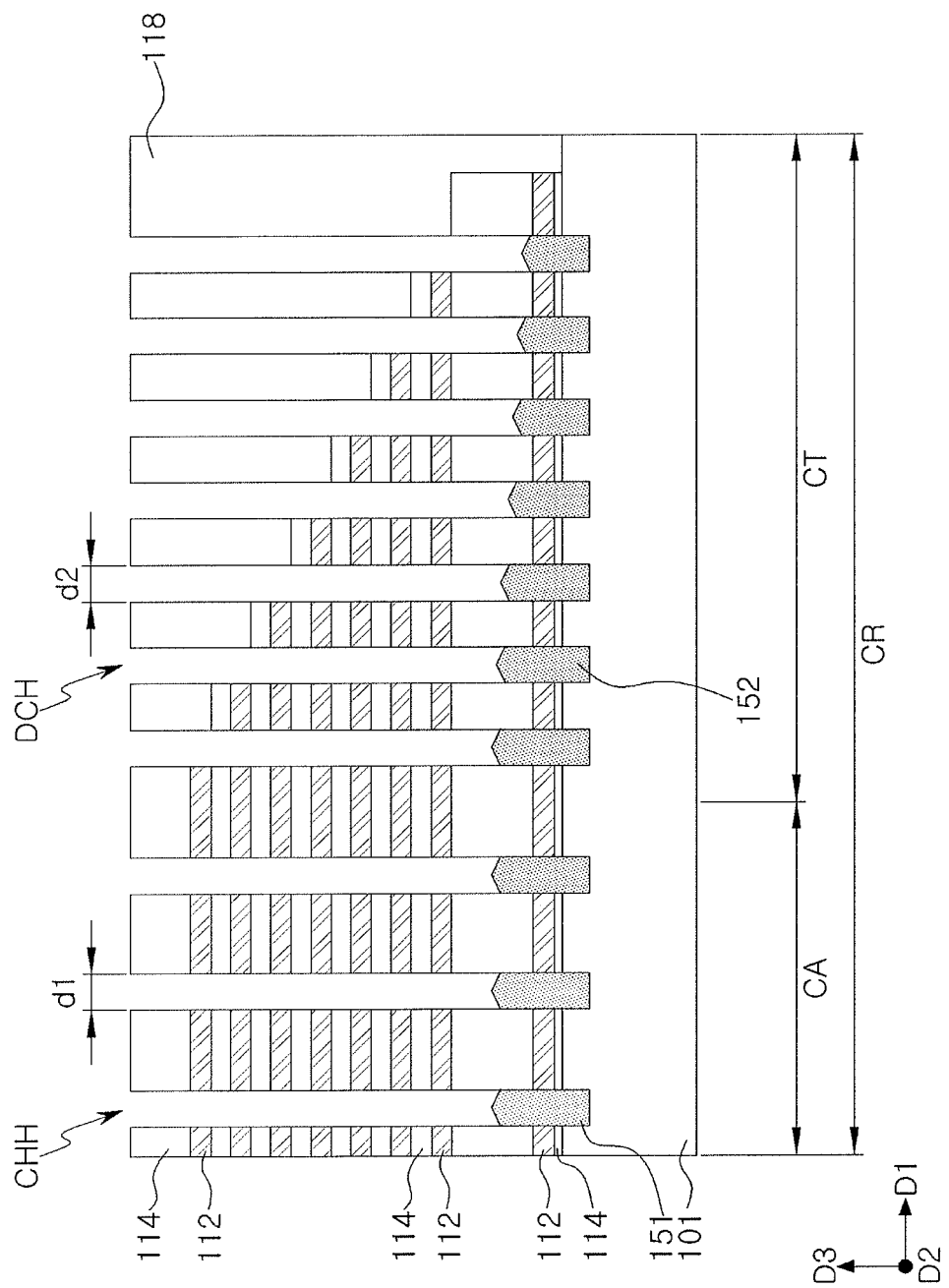

With reference to FIG. 5, cell channel holes CHH passing through the sacrificial layers 112 and the mold insulation layers 114 may be formed in the cell array region CA using an anisotropic etching process. Dummy channel holes DCH passing through the sacrificial layers 112, the mold insulation layers 114, and the interlayer insulating layer 118 may be formed in the connection region CT. The diameter d1 of the cell channel holes CHH may be the same as the diameter d2 of the dummy channel holes DCH. The cell channel holes CHH and the dummy channel holes DCH may extend to the substrate 101, so recesses may be formed in an upper portion of the substrate 101. In an implementation, side walls of the cell channel holes CHH and side walls of the dummy channel holes DCH may be perpendicular to an upper surface of the substrate 101. In an implementation, side walls of the cell channel holes CHH may not be perpendicular to an upper surface of the substrate 101. For example, diameters d1 of the cell channel holes CHH and diameters d2 of the dummy channel holes DCH may be reduced toward the upper surface of the substrate 101.

The cell epitaxial layers 151 may be formed in a lower portion of the cell channel holes CHH, and the dummy epitaxial layers 152 may be formed in a lower portion of the dummy channel holes DCH. The cell epitaxial layers 151 may be referred to as a semiconductor pattern, and the dummy epitaxial layers 152 may be referred to as a dummy semiconductor pattern.

The cell epitaxial layers 151 and the dummy epitaxial layers 152 may be formed by performing a selective epitaxial growth (SEG) using the substrate 101 as a seed. The cell epitaxial layers 151 and the dummy epitaxial layers 152 may be formed of a semiconductor material, e.g., silicon or the like. The cell epitaxial layers 151 and the dummy epitaxial layers 152 may be doped with an impurity. Doping of the impurity may be performed during the SEG, or may be performed using an ion implantation process after the SEG is finished. The impurity may be an impurity with the same conductivity type as the impurity in the substrate 101 or may be an impurity with the opposite conductivity type.

An upper surface of the cell epitaxial layers 151 and an upper surface of the dummy epitaxial layers 152 may be formed higher than (e.g., farther from the substrate 101 than) an upper surface of a sacrificial layer 112 located in a lowermost portion adjacent to the substrate 101. A height of an upper surface of the dummy epitaxial layers 152 may be lower toward an edge of the connection region CT, e.g., as shown in FIG. 5. In an implementation, the upper surface of the cell epitaxial layers 151 and the upper surface of the dummy epitaxial layers 152 may be convexly formed in a direction away from the substrate 101 (e.g., the third direction D3). In an implementation, depending on growth conditions, the upper surface of the cell epitaxial layers 151 and the upper surface of the dummy epitaxial layers 152 may be flat.

Figure 6:
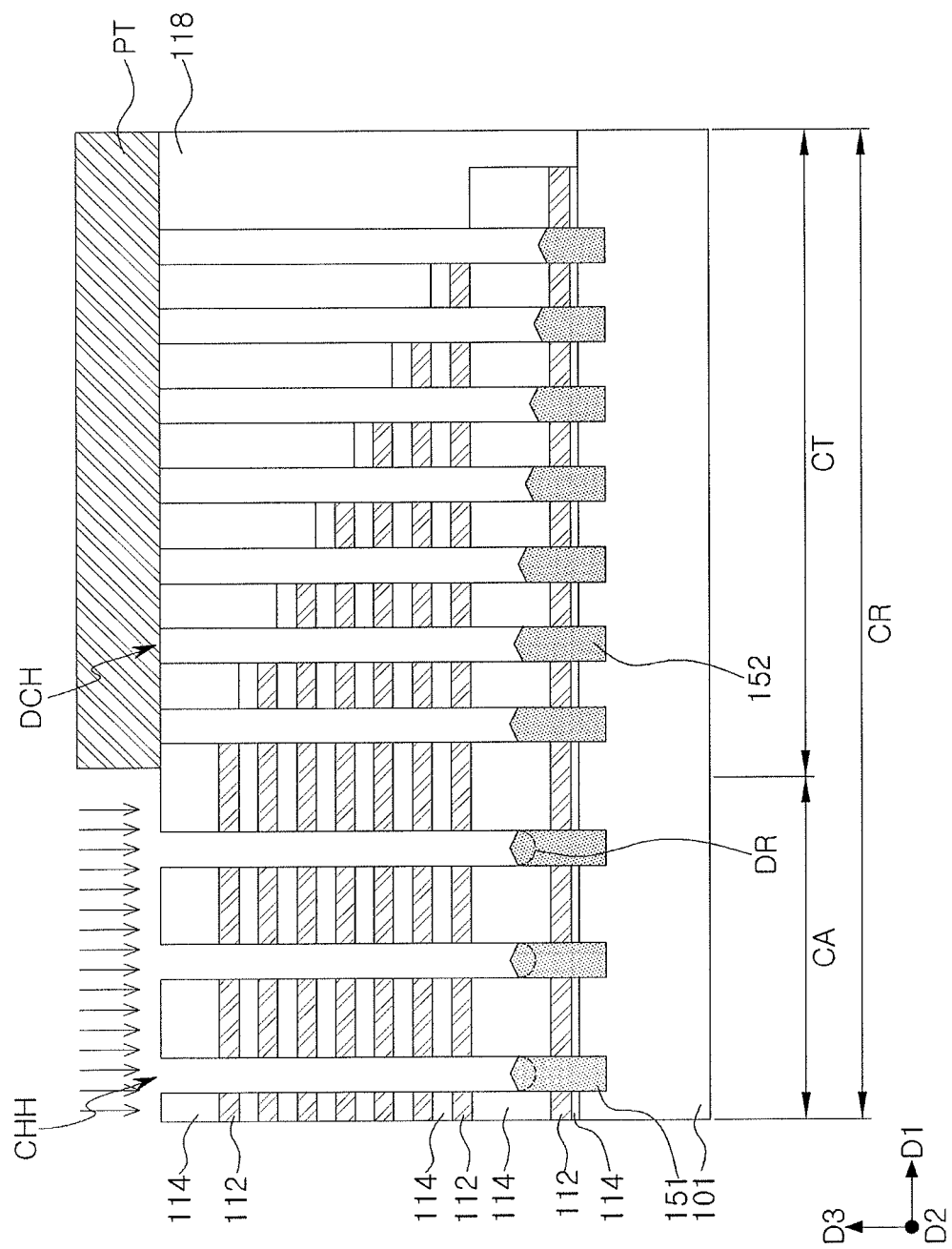

With reference to FIG. 6, carbon may be injected into an upper portion of the cell epitaxial layers 151 in the cell channel holes CHH. The carbon may be formed or injected by an ion implantation process. For the ion implantation process, a protective layer PT blocking the dummy channel holes DCH may be formed on the connection region CT. The protective layer PT may be, e.g., a photoresist layer formed using a photolithography process.

When the ion implantation process of the carbon is completed, the protective layer PT may be removed. When the protective layer PT is a photoresist layer, the protective layer PT may be removed using ashing and stripping processes.

Figure 7:
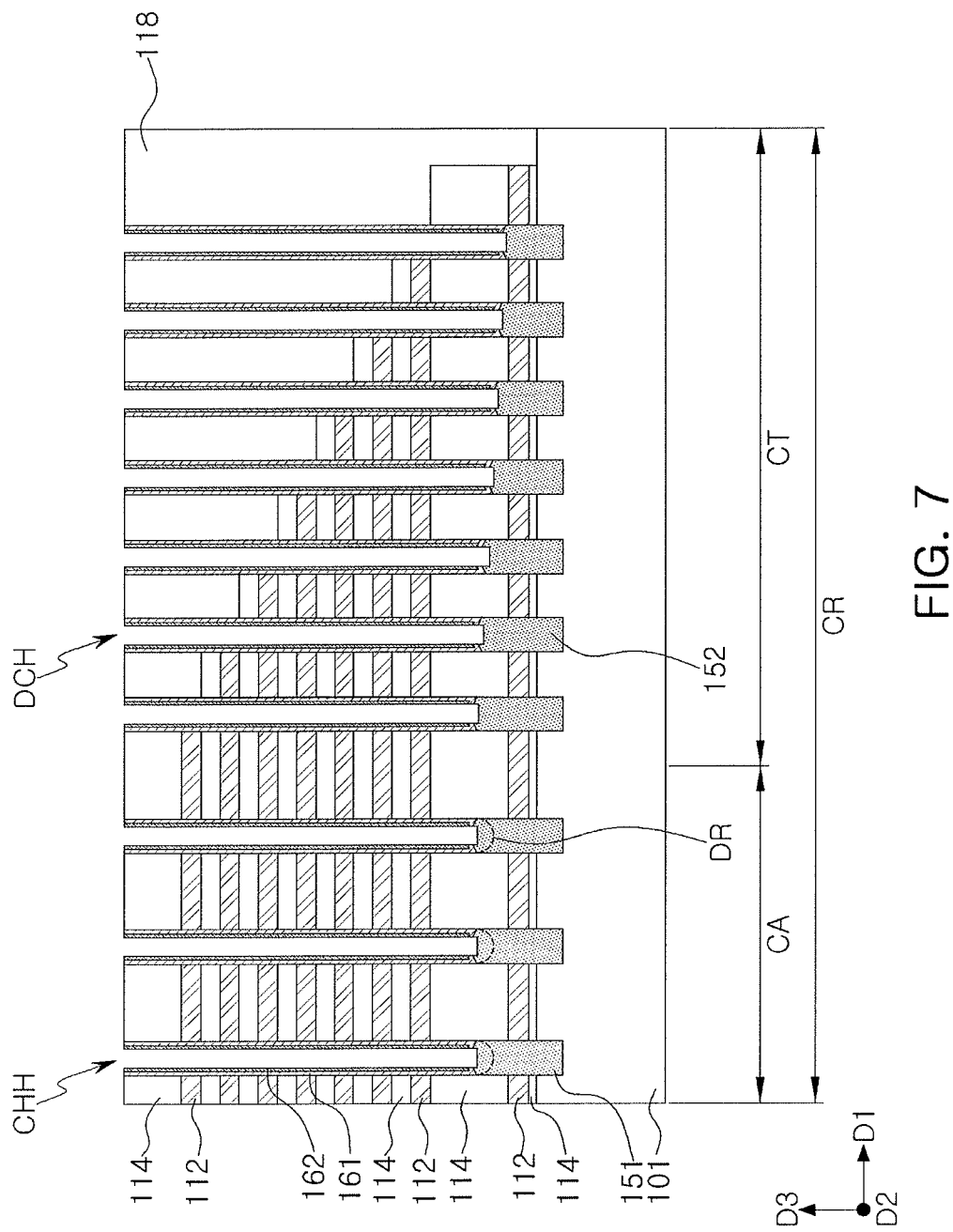

In an implementation, the ion implantation process of the carbon may be performed after a subsequent operation of FIG. 7 is completed.

With reference to FIG. 7, gate dielectric layers 161 covering side walls of the cell channel holes CHH and side walls of the dummy channel holes DCH may be formed. A sacrificial spacer layer 162 may be formed on the gate dielectric layer 161.

First, the gate dielectric layer 161 may be formed to have a uniform thickness on side walls of the cell channel holes CHH and an upper surface of the cell epitaxial layers 151. The gate dielectric layer 161 may be formed to have a uniform thickness on side walls of the dummy channel holes DCH and an upper surface of epitaxial layers 152. The gate dielectric layer 161 may include a blocking layer, a charge storage layer, and a tunneling layer, sequentially formed.

Next, the sacrificial spacer layer 162 may expose a portion of the gate dielectric layer 161 formed on an upper surface of the cell epitaxial layer 151 below or at a bottom of the cell channel holes CHH. The sacrificial spacer layer 162 may expose a portion of the gate dielectric layer 161 formed on an upper surface of the dummy epitaxial layer 152 below or at a bottom of the dummy channel holes DCH. The sacrificial spacer layer 162 may be formed of a semiconductor material, e.g., polycrystalline silicon or amorphous silicon. For example, the sacrificial spacer layer 162 may be polycrystalline silicon.

Next, the sacrificial spacer layer 162 may be used as an etch mask to anisotropically etch the gate dielectric layer 161, having been exposed, to be removed. The gate dielectric layer 161 may have an "L" shaped cross-section on side walls of the cell channel holes CHH and side walls of the dummy channel holes DCH.

When the gate dielectric layer 161 is etched, recesses may be formed in an upper portion of the cell epitaxial layers 151 and an upper portion of the dummy epitaxial layers 152.

Figure 8:
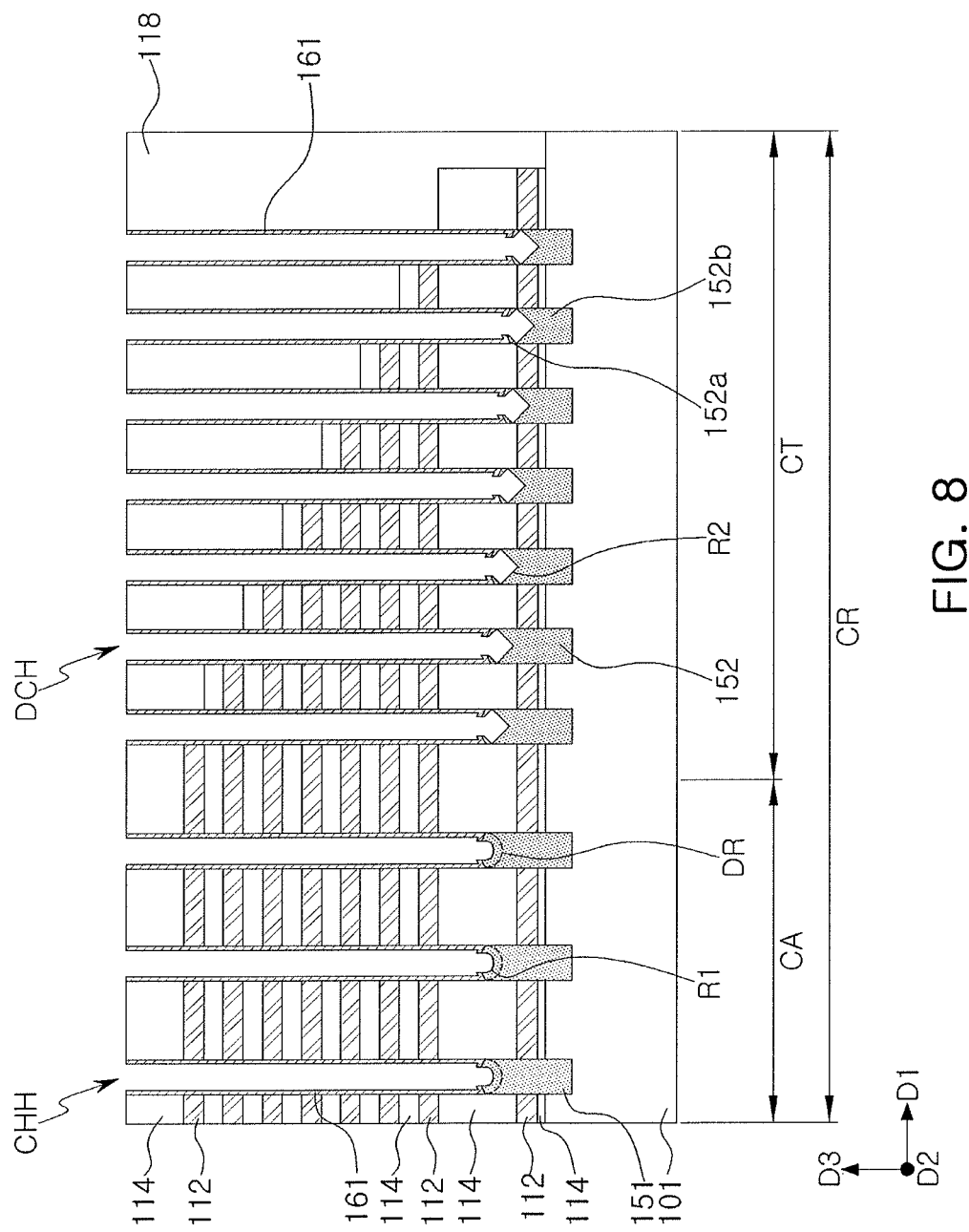

With reference to FIG. 8, the first recesses R1 and the second recesses R2 may be formed in the upper portion of the cell epitaxial layers 151 and the upper portion of the dummy epitaxial layers 152, respectively. In this case, the sacrificial spacer layers 162 may be removed together.

The first recesses R1 and the second recesses R2 may be removed using a wet etching process. The wet etching process may use a solution containing $NH_4OH$, $NH_3OH$, Tetramethylammonium Hydroxide (TMAH), Benzyltrimethylammonium Hydroxide (BTMAH), KOH, NaOH, or combinations thereof.

Depending on the presence or absence of an ion-implanted carbon impurity region, the first recesses R1 and the second recesses R2 may have different shapes. In an implementation, the first recesses R1 may have a downwardly concave shape, and the second recesses R2 may include inclined surfaces extending below the gate dielectric layer 161. The inclined surfaces may be extended to a side wall of the dummy epitaxial layers 152. Due to the second recesses R2, the dummy epitaxial layer 152 may be separated into the upper region 152a and the lower region 152b.

Figure 9:
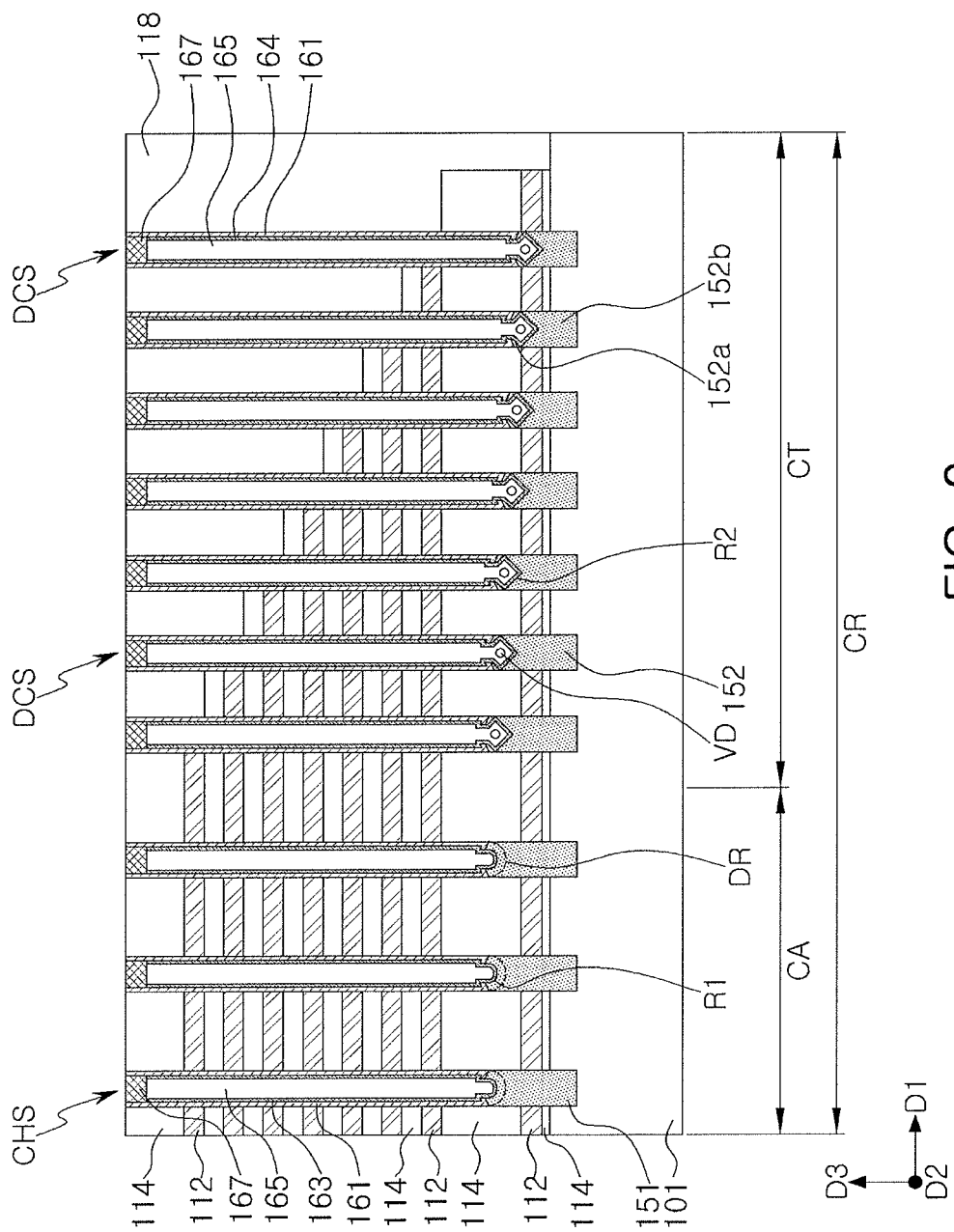

With reference to FIG. 9, the cell channel layers 163 may be formed in the cell channel holes CHH and the first recesses R1, and the dummy channel layers 164 may be formed in the dummy channel holes DCH and the second recesses R2. The insulating layers 165 filling a remaining space of the cell channel holes CHH and the dummy channel holes DCH may be formed. The contact pads 167 may be formed on the cell channel layers 163 and the dummy channel layers 164. Voids VD sealed by the insulating layers 165 may be formed in the second recesses R2.

The cell channel layers 163 and the dummy channel layers 164 may be formed of a semiconductor material such as polycrystalline silicon or amorphous silicon. The cell channel layers 163 and the dummy channel layers 164 may be thicker than a desired final thickness, and then may be controlled to have the desired final thickness using a trimming process. The trimming process may be precisely performed using a solution such as an SC1 solution. The SC1 solution may refer to a solution in which deionized water, $NH_4OH$, and $H_2O_2$ are mixed.

The insulating layers 165 may be formed of an insulating material, e.g., silicon oxide or the like. The contact pads 167 may be, e.g., a doped semiconductor material.

Figure 10:
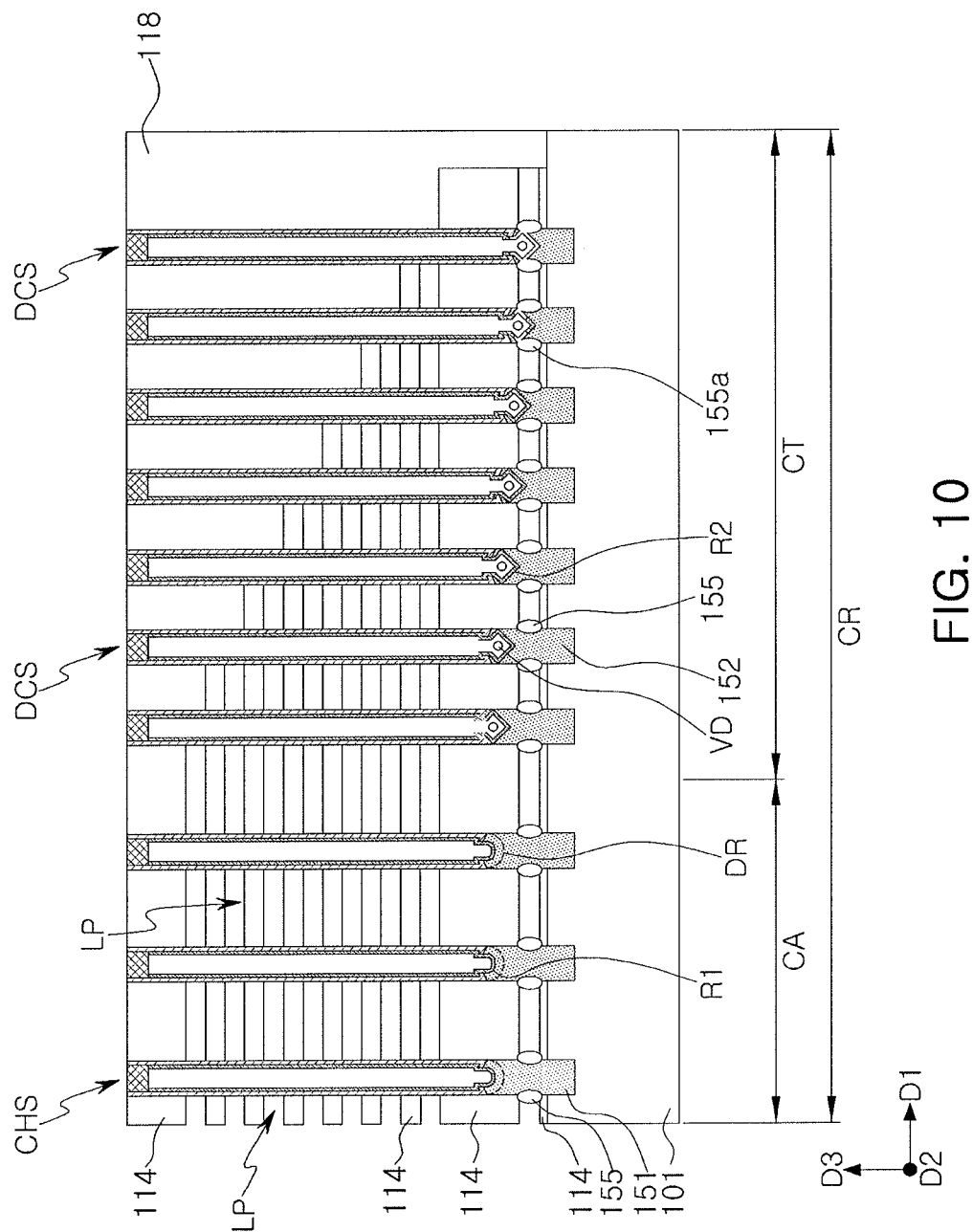

With reference to FIG. 10, the sacrificial layers 112 may be removed using a wet etching process, so a plurality of side openings LP may be formed between the mold insulation layers 114. Through the side openings LP, the gate dielectric layer 161, the cell epitaxial layer 151, and the dummy epitaxial layer 152 may be partially exposed. When the sacrificial layers 112 are silicon nitride and the mold insulation layers 114 are silicon oxide, the wet etching process may be performed using a phosphoric acid solution.

Next, the insulating layers 155 may be formed on the side wall of the cell epitaxial layers 151 exposed through the side openings LP. The insulating layers 155 may be formed to have a ring shape along the side wall of the cell epitaxial layer 151. The insulating layers 155 may have a cross section having a convex or oval shape. The insulating layers 155 may be formed on a side wall of the dummy epitaxial layers 152, exposed through the side openings LP. The insulating layers 155a may be formed on the side wall of the dummy epitaxial layers 152 adjacent to an edge of the connection region CT. The insulating layers 155a may have a different shape from the insulating layers 155.

The insulating layers 155 may be formed by oxidizing a portion of the cell epitaxial layers 151 or the dummy epitaxial layers 152. The insulating layers 155a may be formed by oxidizing a portion of the dummy epitaxial layers 152 and the dummy channel layers 164 in the second recess R2.

Referring again to FIG. 3, the gate electrode layers 131 may be formed in the side openings LP.

The gate electrode layers 131 may include a metal, metal nitride, polycrystalline silicon, or a metal silicide material. The metal may include tungsten (W), copper (Cu), aluminum (Al), or the like. The metal nitride may include tungsten nitride (WN), tantalum nitride (TaN), titanium nitride (TiN), or combinations thereof. The gate electrode layers 131 may include titanium nitride (TiN) and tungsten (W).

Figure 11:
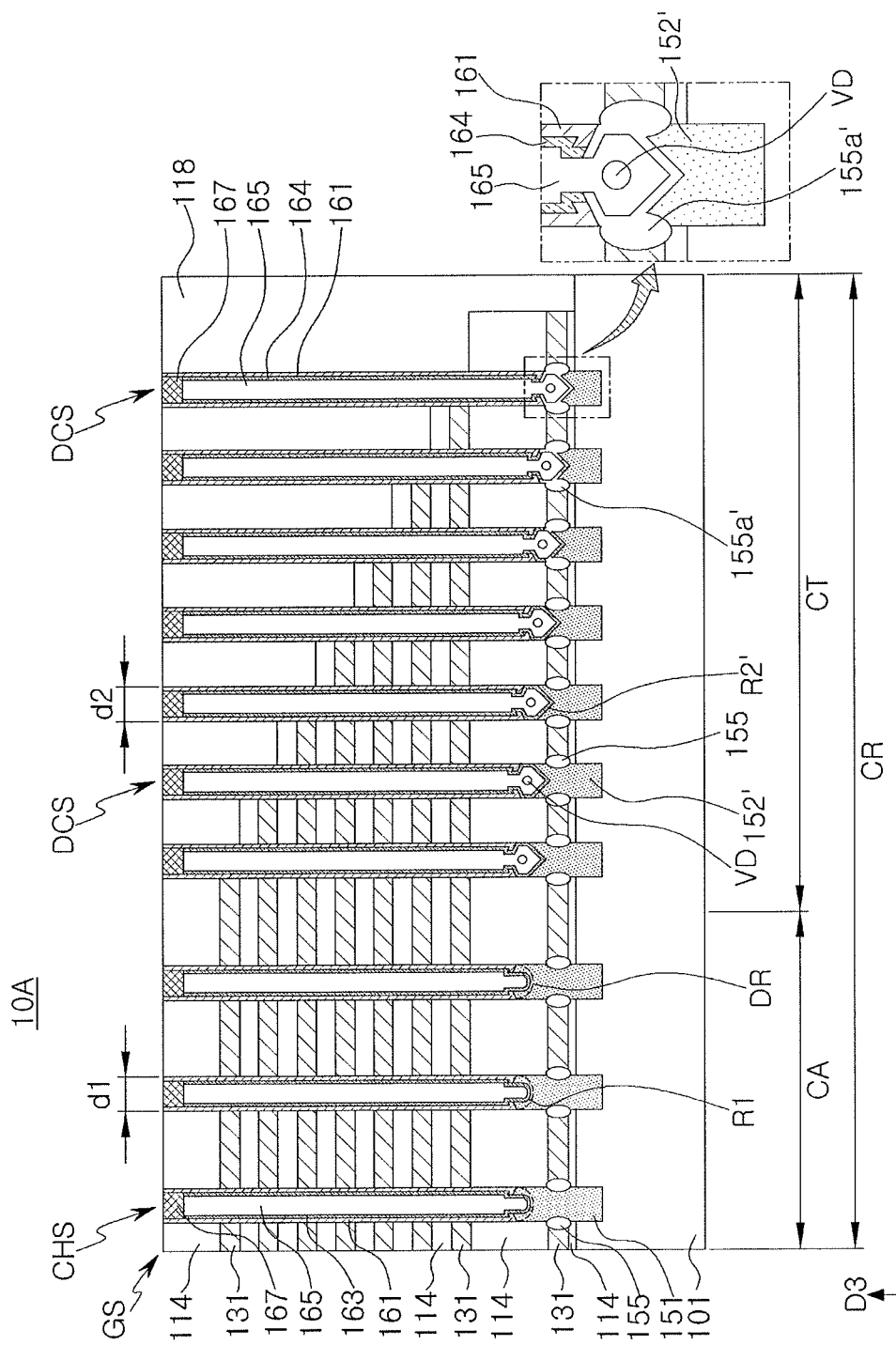
FIG. 11 illustrates a schematic cross-sectional view of a vertical-type memory device according to an example embodiment.

FIG. 11 illustrates a cross-sectional view of a vertical-type memory device 10A according to an example embodiment. With respect to the vertical-type memory device 10A of FIG. 11, the difference from the vertical-type memory device 10 of FIG. 3 will be illustrated, and repeated descriptions of the same components and structures may be omitted.

In the case of the vertical-type memory device 10A of FIG. 11, when compared to the vertical-type memory device 10 of FIG. 3, a depth of the first recesses R1 may be deeper, and a shape of second recesses R2' may be different. In the connection region CT, the second recesses R2' may be expanded to a lower surface of the gate dielectric layer 161, and may be expanded downwards in a direction closer to the substrate 101. Thus, in the connection region CT, a dummy epitaxial layer 152' may have a similar structure to the lower region 152b of the dummy epitaxial layer 152 of the vertical-type memory device 10 of FIG. 3. Moreover, when compared to the vertical-type memory device 10 of FIG. 3, an insulating layer 155a' may be formed even in a position closer to the cell array region CA.

Figure 12:
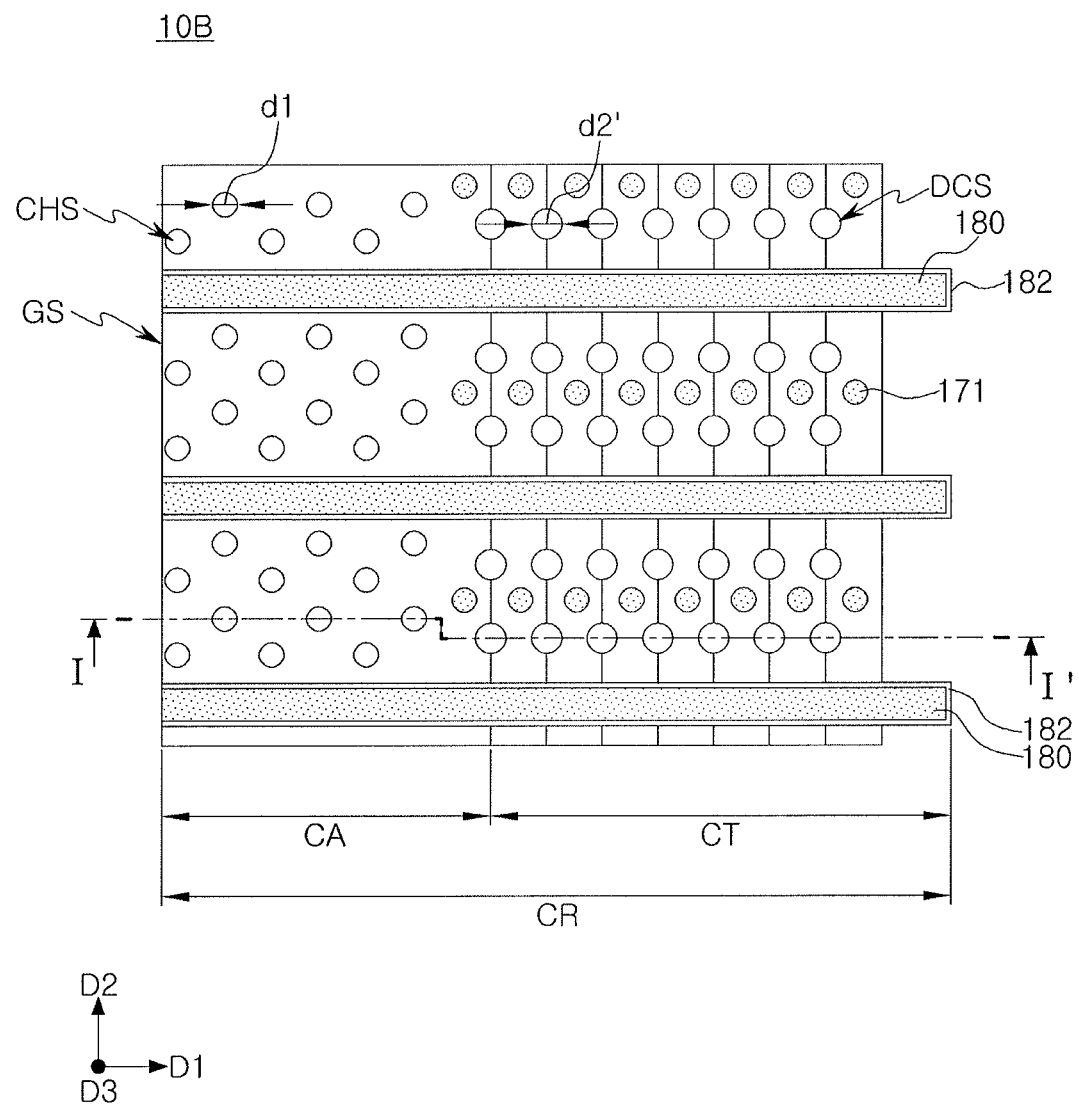
FIG. 12 illustrates a schematic plan view of a vertical-type memory device according to an example embodiment.

FIG. 12 illustrates a schematic plan view of a vertical-type memory device 10C according to an example embodiment. FIG. 12 illustrates region A of FIG. 1.

With reference to FIG. 12, in the vertical-type memory device 10C according to an example embodiment, when compared to the vertical-type memory device 10 of FIG. 2, a diameter d2' of the plurality of dummy channel structures DCS may be greater than a diameter d1 of the plurality of channel structures CHS. Repeated descriptions of the same components and structures as the vertical-type memory device 10 of FIG. 2 may be omitted.

Figure 13:
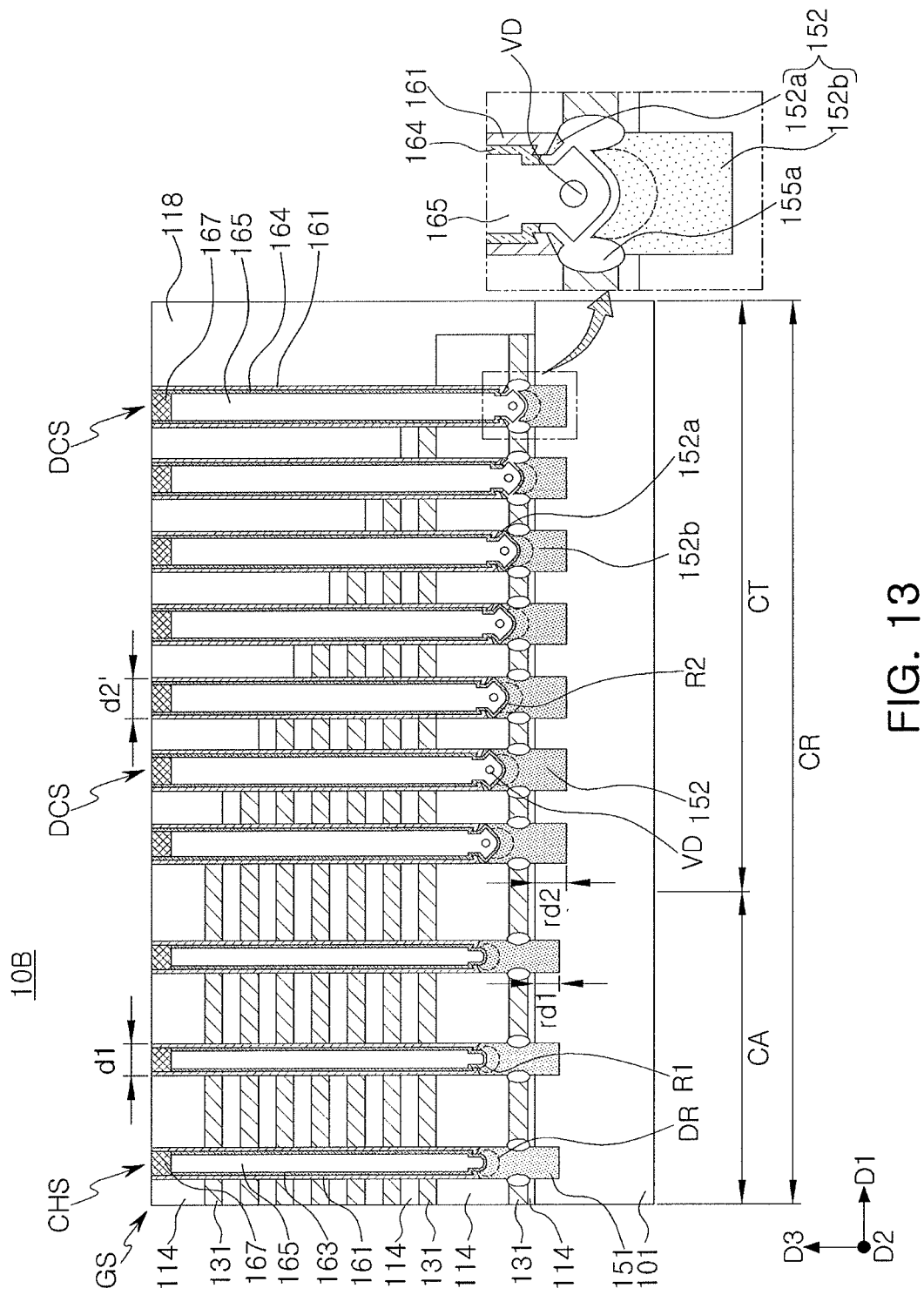
FIG. 13 illustrates a schematic cross-sectional view of a vertical-type memory device according to an example embodiment.

FIG. 13 illustrates a schematic cross-sectional view of a vertical-type memory device 10B according to an example embodiment. FIG. 13 is a cross-sectional view taken along line I-I' of FIG. 12. With respect to the vertical-type memory device 10B illustrated in FIG. 13, the difference from the vertical-type memory device 10 of FIG. 3 will be illustrated. Repeated descriptions of the same components and structures as the vertical-type memory device 10 of FIG. 3 may be omitted.

With reference to FIGS. 12 and 13 together, the vertical-type memory device 10B may include a substrate 101, channel structures CHS, dummy channel structures DCS, and the like.

A diameter d1 of the channel structures CHS may be different from a diameter d2' of the dummy channel structures DCS. The diameter d2' of the dummy channel structures DCS may be greater than the diameter d1 of the channel structures CHS. The cell epitaxial layers 151 and the dummy epitaxial layers 152 may be disposed in recesses of the substrate 101. A second depth rd2 of recesses in which the dummy epitaxial layers 152 are disposed may be deeper than a first depth rd1 of recesses in which the cell epitaxial layers 151 are disposed.

In addition, each of the second recesses R2 in an upper portion of the dummy epitaxial layers 152 may have inclined surfaces extended below the gate dielectric layers 161 and a lower surface having a curvature. The carbon impurity regions DR may be disposed not only below the first recesses R1 of the cell epitaxial layers 151, but also below the second recesses R2 of the dummy epitaxial layers 152.

FIGS. 14 through 18 illustrate sectional views of stages in a method of manufacturing the vertical-type memory device 10B according to an example embodiment. In FIGS. 14 through 18, regions corresponding to FIG. 13 will be illustrated.

Figure 14:
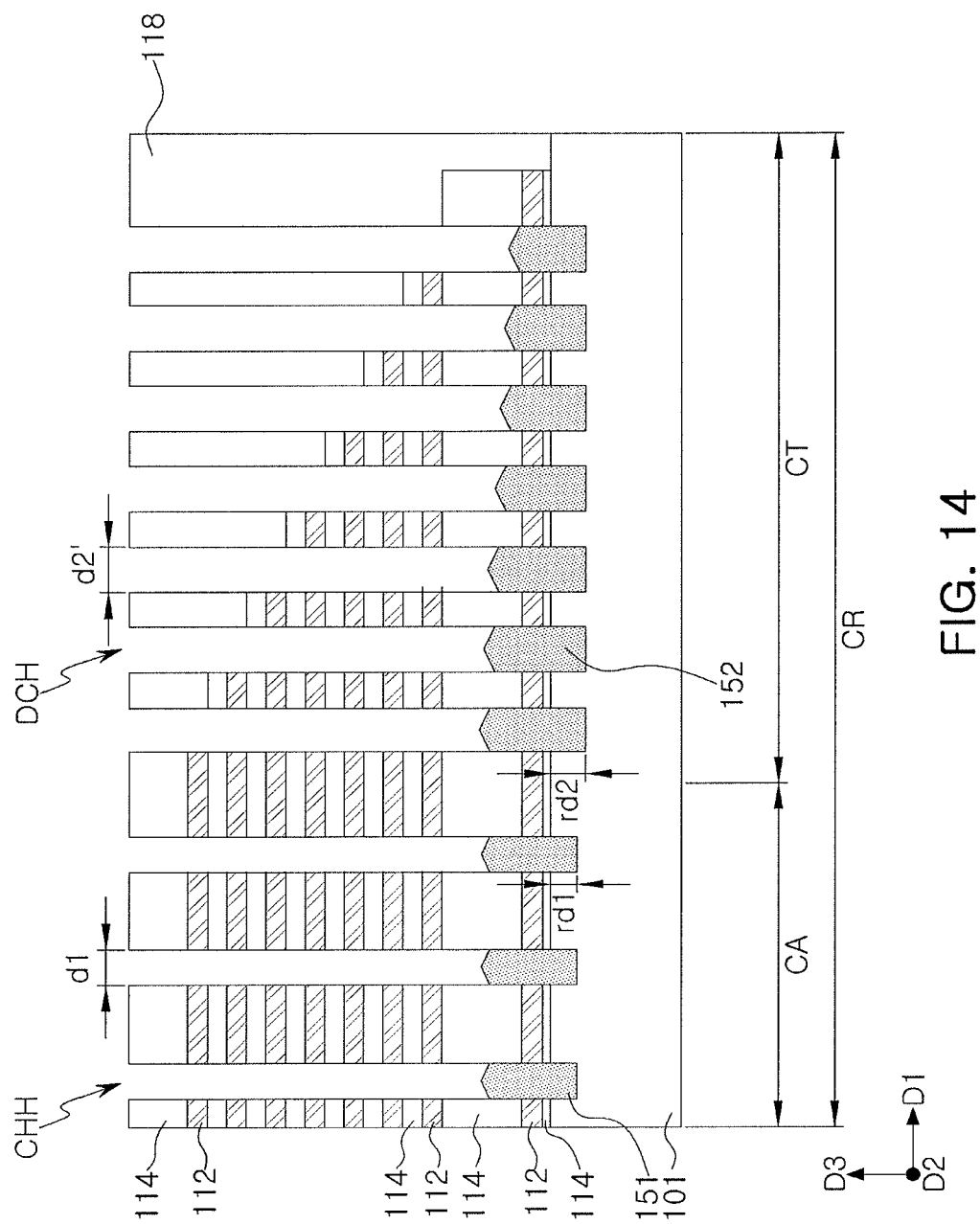
FIGS. 14 through 18 illustrate sectional views of stages in a method of manufacturing a vertical-type memory device according to an example embodiment.

With reference to FIG. 14, the sacrificial layers 112 and the mold insulation layers 114 may be alternately stacked on the substrate 101. The cell channel holes CHH passing through the sacrificial layers 112 and the mold insulation layers 114 may be formed in the cell array region CA using an anisotropic etching process. In the connection region CT, the dummy channel holes DCH passing through the sacrificial layers 112, the mold insulation layers 114, and the interlayer insulating layer 118 may be formed. A diameter d1 of the cell channel holes CHH may be different from a diameter d2' of the dummy channel holes DCH. The diameter d2' of the dummy channel holes DCH may be greater than a diameter d1 of the cell channel holes CHH. The cell channel holes CHH and the dummy channel holes DCH may be extended to the substrate 101, so recesses may be formed in an upper portion of the substrate 101. The diameter d2' of the dummy channel holes DCH is greater than a diameter d1 of the cell channel holes CHH, and the second depth rd2 of the recesses in a lower portion of the dummy channel holes DCH may be deeper than the first depth rd1 of the recesses in a lower portion of the cell channel holes CHH.

The cell epitaxial layers 151 may be formed below or at the bottom of the cell channel holes CHH, and the dummy epitaxial layers 152 may be formed below or at the bottom of the dummy channel holes DCH. The cell epitaxial layers 151 may be referred to as a semiconductor pattern, and the dummy epitaxial layers 152 may be referred to as a dummy semiconductor pattern. The cell epitaxial layers 151 and the dummy epitaxial layers 152 may be formed using a selective epitaxial growth (SEG). The cell epitaxial layers 151 and the dummy epitaxial layers 152 may be formed of a semiconductor material such as silicon, or the like. The cell epitaxial layers 151 and the dummy epitaxial layers 152 may be doped with an impurity. An upper surface of the cell epitaxial layers 151 and an upper surface of the dummy epitaxial layers 152 may be formed to be higher than an upper surface of a sacrificial layer 112 located in a lowermost portion adjacent to the substrate 101. A height of the upper surface of the dummy epitaxial layers 152 may be lower toward an edge of the connection region CT.

Figure 15:
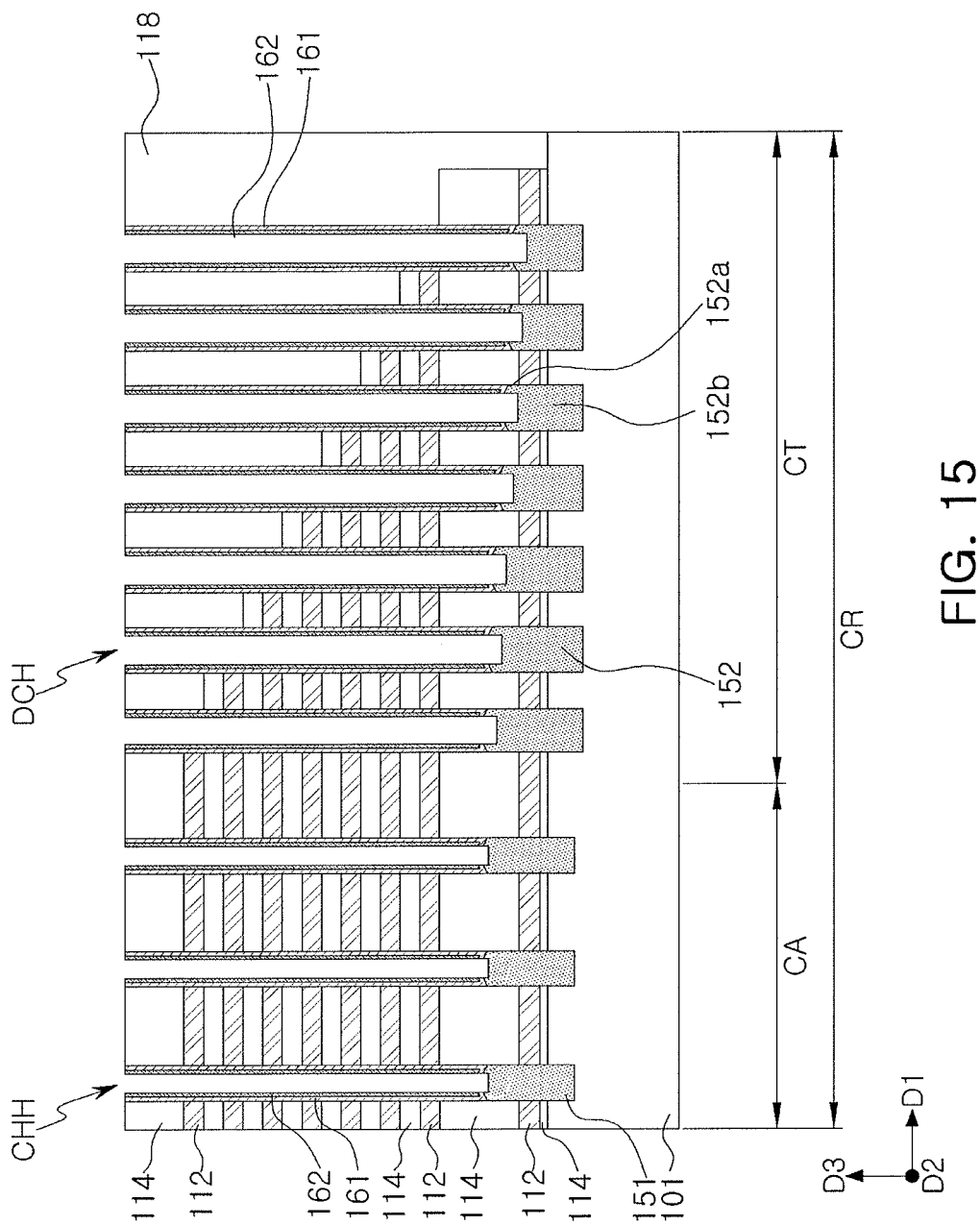

With reference to FIG. 15, the gate dielectric layers 161, covering side walls of the cell channel holes CHH and side walls of the dummy channel holes DCH, may be formed. The sacrificial spacer layer 162 may be formed on the gate dielectric layer 161.

First, the gate dielectric layer 161 may be formed to have a uniform thickness on side walls of the cell channel holes CHH and an upper surface of the cell epitaxial layers 151. The gate dielectric layer 161 may be formed to have a uniform thickness on side walls of the dummy channel holes DCH and an upper surface of the epitaxial layers 152.

Next, the sacrificial spacer layer 162 may expose a portion of the gate dielectric layer 161 on an upper surface of the cell epitaxial layer 151 below the cell channel holes CHH. The sacrificial spacer layer 162 may expose a portion of the gate dielectric layer 161 on an upper surface of the dummy epitaxial layer 152 below the dummy channel holes DCH.

Next, a sacrificial spacer layer 151s is used as an etch mask to anisotropically etch the gate dielectric layer 161, having been exposed, to be removed.

When the gate dielectric layer 161 is etched, recesses may be formed in an upper portion of the cell epitaxial layers 151 and an upper portion of the dummy epitaxial layers 152. As a diameter d2' of the dummy channel holes DCH is greater than a diameter d1 of the cell channel holes CHH, a depth of the recesses in an upper portion of the dummy epitaxial layers 152 may be deeper than a depth of the recesses in an upper portion of the cell epitaxial layers 151.

Figure 16:
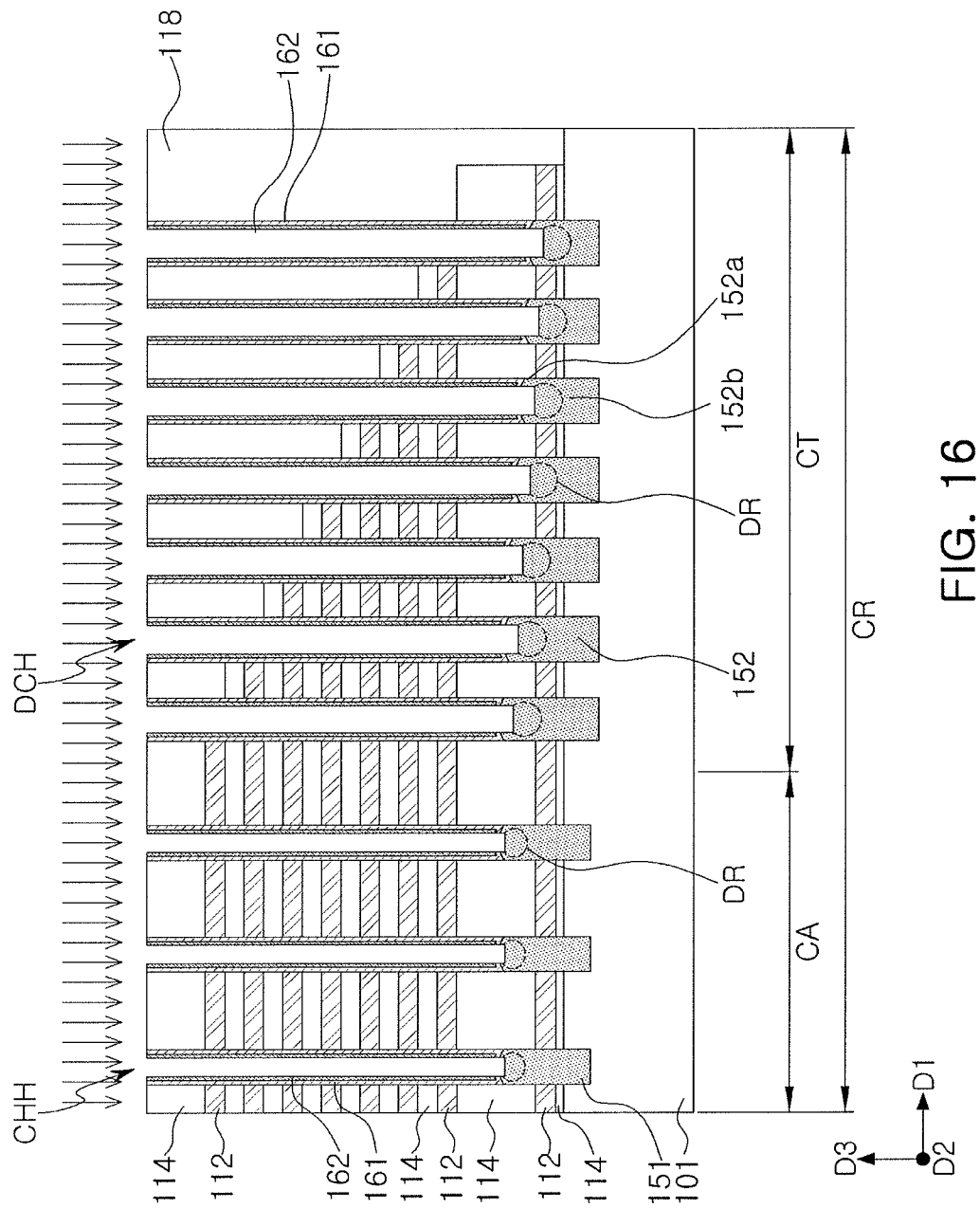

With reference to FIG. 16, a carbon impurity regions DR may be formed in an upper portion of the cell epitaxial layers 151 in the cell channel holes CHH and an upper portion of the dummy epitaxial layers 152 in the dummy channel holes DCH. The carbon may be formed in an ion implantation process. As a depth of the recesses in an upper portion of the dummy epitaxial layers 152 is deeper than a depth of the recesses in an upper portion of the cell epitaxial layers 151, in the case of the dummy epitaxial layers 152, the carbon impurity regions DR may be formed deeper, compared to the case of the cell epitaxial layer 151.

Figure 17:
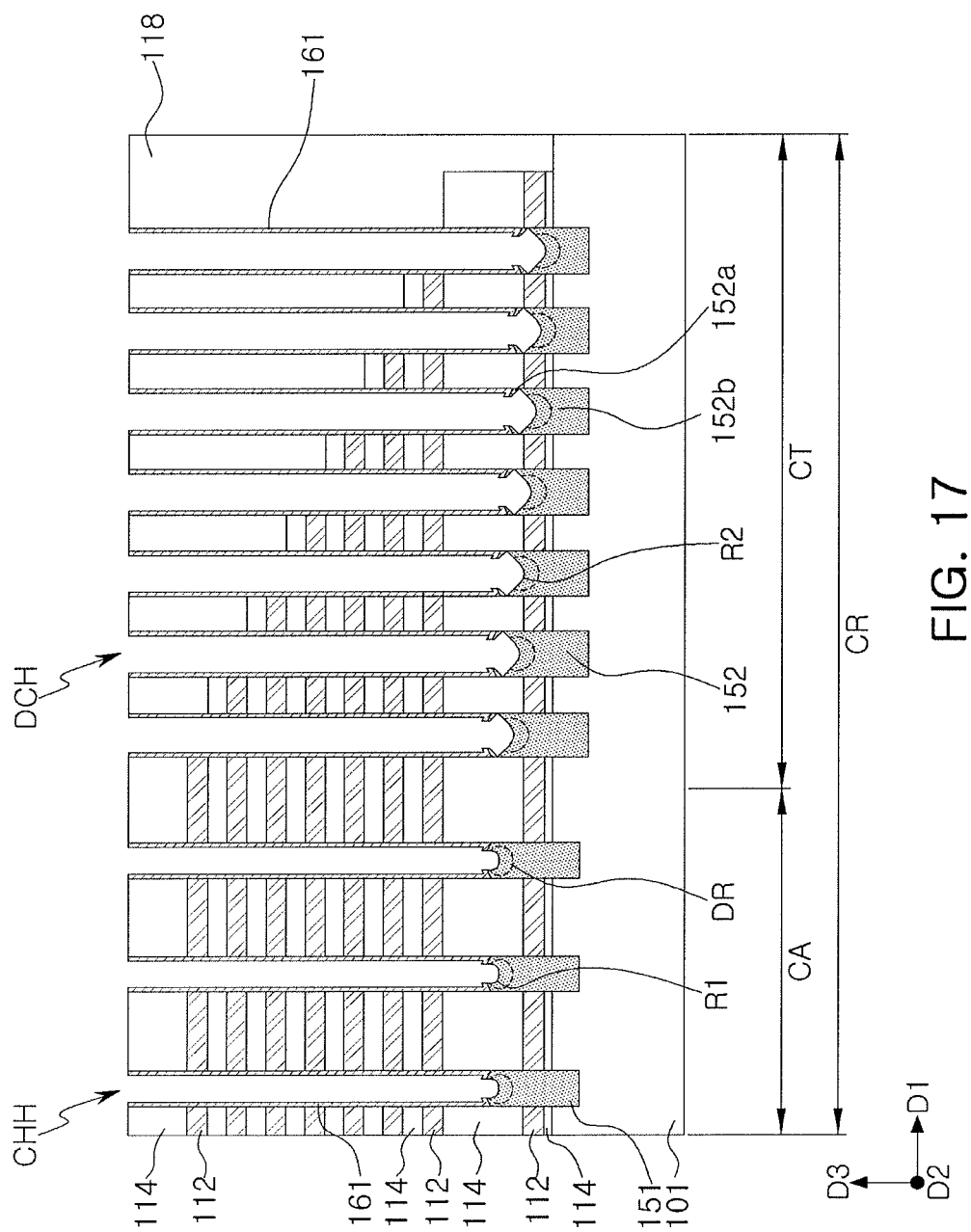

With reference to FIG. 17, the first recesses R1 and the second recesses R2 may be formed in the upper portion of the cell epitaxial layers 151 and the upper portion of the dummy epitaxial layers 152, respectively. In this case, the sacrificial spacer layers 162 may be removed together.

The first recesses R1 and the second recesses R2 may be removed using a wet etching process. The wet etching process may use a solution containing $NH_4OH$, $NH_3OH$, Tetramethylammonium Hydroxide (TMAH), Benzyltrimethylammonium Hydroxide (BTMAH), KOH, NaOH, or combinations thereof.

Depending on a depth of an ion-implanted carbon impurity region, the first recesses R1 and the second recesses R2 may have different shapes. For example, the first recesses R1 may have a downwardly concave shape, and the second recesses R2 may have inclined surfaces extended below the gate dielectric layer 161. The inclined surfaces may be extended to a side wall of the dummy epitaxial layers 152. The second recesses R2 may have lower surfaces having curvature. Due to the second recesses R2, the dummy epitaxial layer 152 may be separated into the upper region 152a and the lower region 152b.

Figure 18:
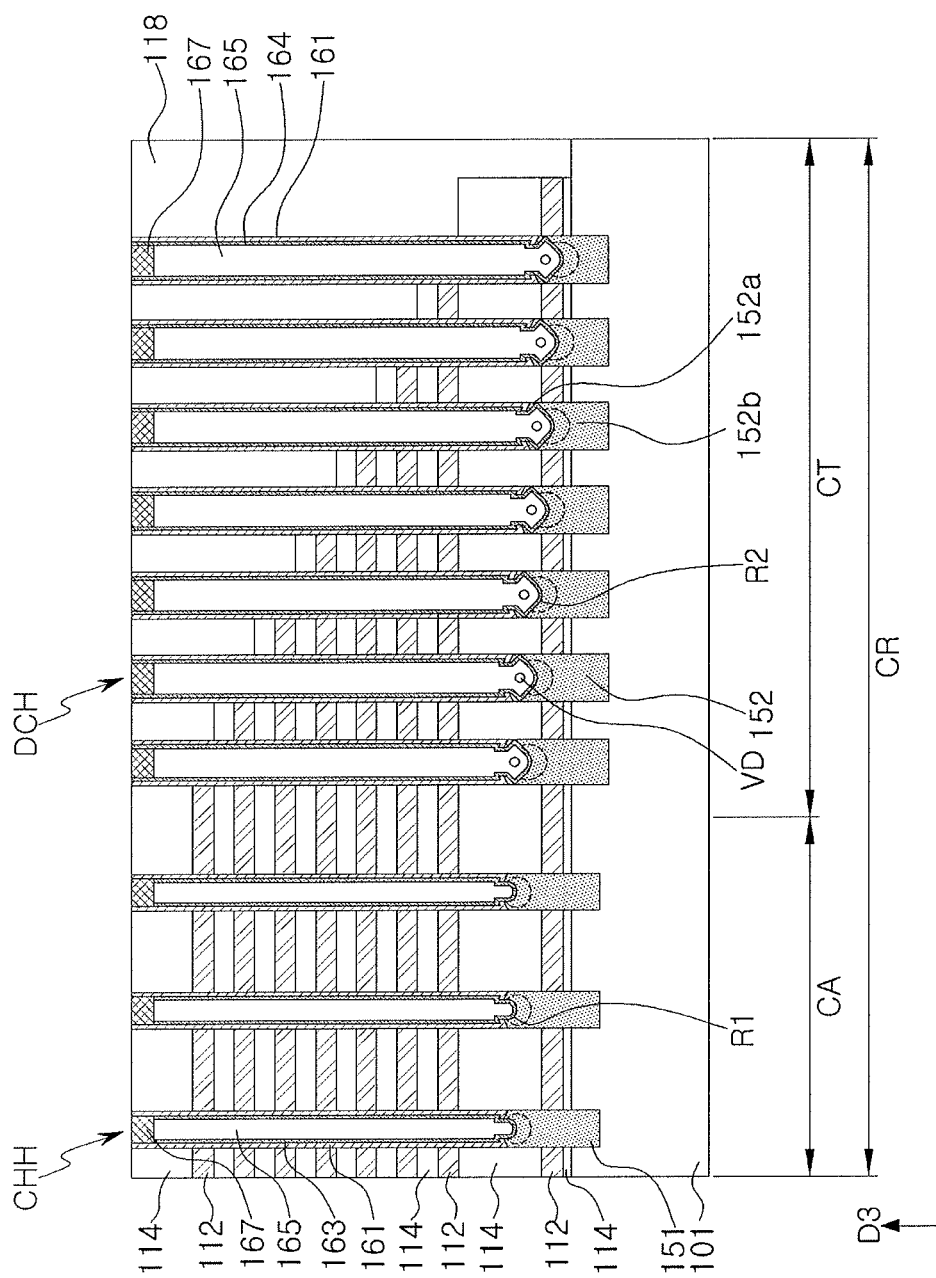

With reference to FIG. 18, channel layers 163 may be formed in the cell channel holes CHH, the first recesses R1, the dummy channel holes DCH, and the second recesses R2. The insulating layers 165 filling a remaining space of the cell channel holes CHH and the dummy channel holes DCH may be formed. The contact pads 167 may be formed on the channel layers 163 and the dummy channel layers 164. The voids VD sealed by the insulating layers 165 may be formed in the second recesses R2.

Next, removing the sacrificial layers 112 and forming insulating layers 155 and 155a, illustrated with reference to FIG. 10, may be performed.

Referring again to FIG. 13, the gate electrode layers 131 may be formed in the side openings LP.

Figure 19:
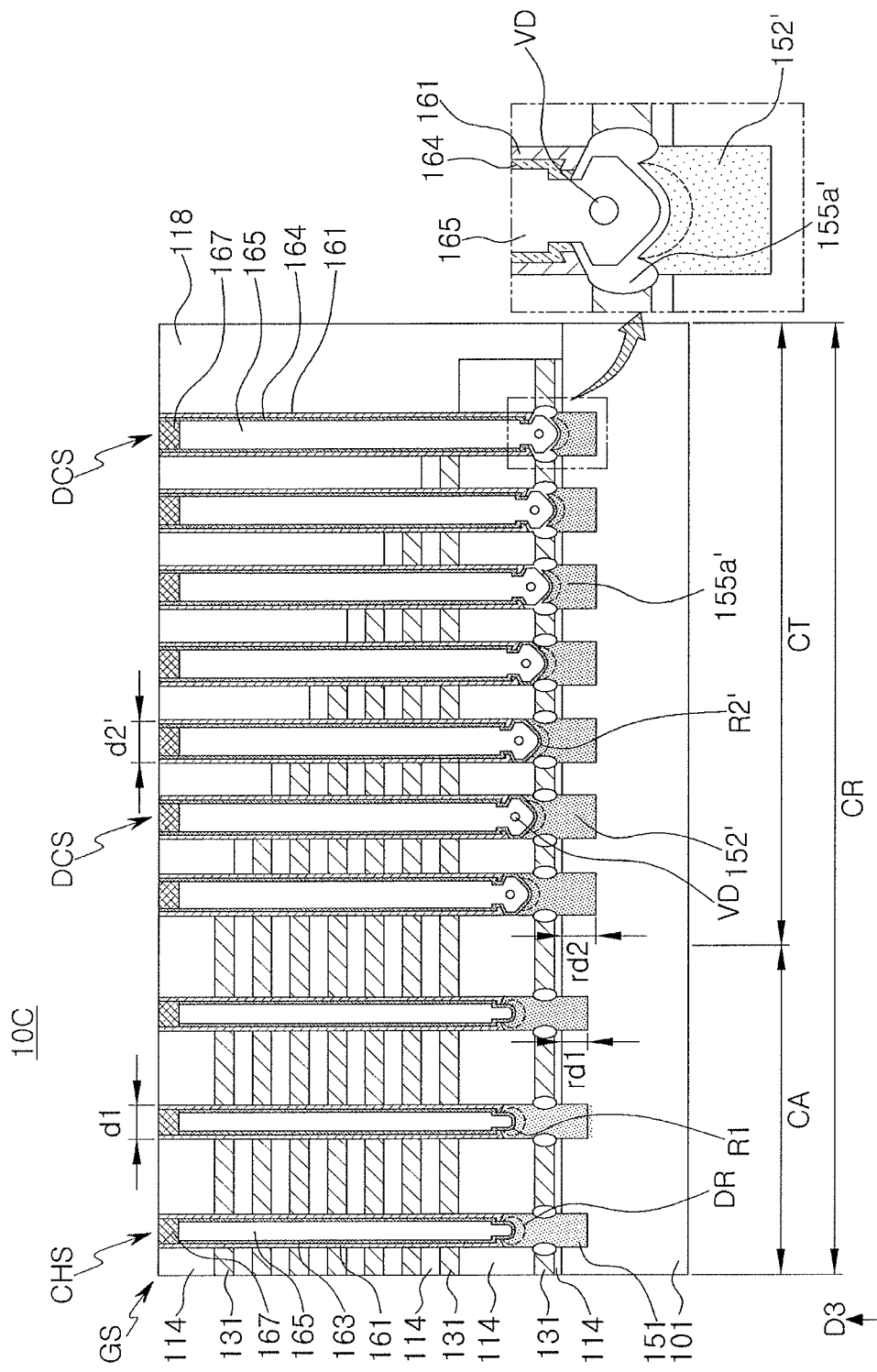
FIG. 19 illustrates a schematic cross-sectional view of a vertical-type memory device according to an example embodiment.

FIG. 19 illustrates a schematic cross-sectional view of the vertical-type memory device 10C according to an example embodiment. With respect to the vertical-type memory device 10C of FIG. 19, the difference from the vertical-type memory device 10B of FIG. 13 will be illustrated, and repeated descriptions of the same components and structures may be omitted.

In the case of the vertical-type memory device 10C of FIG. 19, when compared to the vertical-type memory device 10B of FIG. 13, a depth of the first recesses R1 may be deeper, and a shape of the second recesses R2' may be different. In the connection region CT, the second recesses R2' may be expanded to a lower surface of the gate dielectric layer 161, and may be expanded downwards in a direction closer to the substrate 101. Thus, in the connection region CT, the dummy epitaxial layer 152' may have a similar structure to the lower region 152b of the dummy epitaxial layer 152 of the vertical-type memory device 10 of FIG. 3. In addition, when compared to the vertical-type memory device 10 of FIG. 3, the insulating layer 155a' may be formed in a position closer to the cell array region CA.

In an implementation, as illustrated in FIGS. 1 through 18, vertical-type memory devices may include the peripheral circuit region PR disposed to be adjacent to the cell region CR horizontally. In an implementation, the peripheral circuit region PR may be disposed vertically below the cell region CR. In an implementation, the cell region CR may be disposed below the peripheral circuit region PR.

As set forth above, according to example embodiments, leakage current flowing through a dummy structure in a connection region is blocked, so that a vertical-type memory device having excellent electrical characteristics may be provided.

The embodiments may provide a vertical-type memory device having excellent electrical characteristics.

The embodiments may provide a method of manufacturing a vertical-type memory device having excellent electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical-type memory device, comprising:
a substrate having a cell array region and a connection region adjacent to the cell array region;
a plurality of gate electrode layers stacked on the cell array region and the connection region of the substrate, the plurality of gate electrode layers forming a stepped structure in the connection region;
a cell channel layer in the cell array region, the cell channel layer passing through the plurality of gate electrode layers;
at least one dummy channel layer in the connection region, the at least one dummy channel layer passing through at least one gate electrode layer of the plurality of gate electrode layers;
a cell epitaxial layer disposed below the cell channel layer; and
at least one dummy epitaxial layer disposed below the at least one dummy channel layer,
wherein the at least one dummy epitaxial layer has a shape that is different from a shape of the cell epitaxial layer,
wherein a lower end of the at least one dummy channel layer is closer to the substrate than a lower end of the cell channel layer, and
wherein the at least one dummy channel layer is electrically insulated from the substrate by an insulating material.

2. The vertical-type memory device as claimed in claim 1, wherein the at least one dummy epitaxial layer has an upper region and a lower region having different shapes.

3. The vertical-type memory device as claimed in claim 2, further comprising an insulating layer disposed on a side wall of a portion of the at least one dummy epitaxial layer and extending to the at least one dummy channel layer,
wherein the upper region and the lower region of the at least one dummy epitaxial layer are separated from each other by the insulating layers.

4. The vertical-type memory device as claimed in claim 2, wherein:
the upper region of the at least one dummy epitaxial layer has a ring shape, and
a thickness of the upper region of the at least one dummy epitaxial layer changes in a direction away from a center thereof.

5. The vertical-type memory device as claimed in claim 2, wherein an upper surface of the lower region of the at least one dummy epitaxial layer includes a ring-shaped protrusion portion.

6. The vertical-type memory device as claimed in claim 5, wherein the protrusion portion has a pointed end portion.

7. The vertical-type memory device as claimed in claim 1, wherein the at least one dummy epitaxial layer is separated from the at least one dummy channel layer by the insulating material.

8. The vertical-type memory device as claimed in claim 1, wherein:
the at least one dummy channel layer includes a plurality of dummy channel layers,
the at least one dummy epitaxial layer includes a plurality of dummy epitaxial layers, and
heights of the plurality of dummy epitaxial layers are reduced in a direction from a portion of the connection region adjacent to the cell array region toward an outer edge of the connection region.

9. The vertical-type memory device as claimed in claim 8, further comprising:
a plurality of gate dielectric layers surrounding the plurality of dummy channel layers; and
a plurality of voids disposed below the plurality of gate dielectric layers, respectively, in the connection region.

10. The vertical-type memory device as claimed in claim 9, wherein positions of the voids of the plurality of voids move closer to the substrate in a direction from a portion of the connection region adjacent to the cell array region toward the outer edge of the connection region.

11. The vertical-type memory device as claimed in claim 1, wherein:
the at least one dummy epitaxial layer includes an upper region and a lower region, and
the upper region is formed of a same material as the lower region.

12. A vertical-type memory device, comprising:
a substrate having a cell array region and a connection region located outside the cell array region;
a plurality of gate electrode layers stacked on the cell array region and the connection region of the substrate, the plurality of gate electrode layers forming a stepped structure in the connection region;
a dummy channel layer disposed in the connection region, the dummy channel layer passing through the plurality of gate electrode layers;
a dummy epitaxial layer disposed below the dummy channel layer;
a dummy epitaxial insulating layer disposed between a portion of the dummy epitaxial layer and the dummy channel layer; and
a channel insulating layer filling an internal space of the dummy channel layer,
wherein the dummy epitaxial insulating layer is in contact with the channel insulating layer,
wherein the dummy epitaxial layer includes an upper region and a lower region spaced apart from each other with the dummy epitaxial insulating layer therebetween.

13. The vertical-type memory device as claimed in claim 12, further comprising a void between the upper region and the lower region, the void being sealed by the channel epitaxial insulating layer.

14. The vertical-type memory device as claimed in claim 12, wherein:
the upper region has a ring shape, and
a thickness of the upper region changes in a direction away from a center thereof.

15. The vertical-type memory device as claimed in claim 12, wherein the upper region is formed of a same material as the lower region.

16. The vertical-type memory device as claimed in claim 12, further comprising a cell channel layer disposed in the cell array region, the cell channel layer passing through the plurality of gate electrode layers, wherein a lower end of the dummy channel layer is closer to the substrate than a lower end of the cell channel layer.

17. A vertical-type memory device, comprising:

a substrate;

a plurality of gate electrode layers stacked on the substrate;

a dummy channel hole passing through at least one among the plurality of gate electrode layers;

at least one dummy channel layer in the dummy channel hole;

a gate dielectric layer surrounding an outer side of the at least one dummy channel layer;

an upper dummy epitaxial layer in contact with a lower surface of the gate dielectric layer; and a lower dummy epitaxial layer spaced apart from the upper dummy epitaxial layer, wherein the at least one dummy channel layer is electrically insulated from the substrate by an insulating material.

18. The vertical-type memory device as claimed in claim 17, wherein the upper dummy epitaxial layer and the lower dummy epitaxial layer have different shapes.

19. The vertical-type memory device as claimed in claim 17, wherein the at least one dummy channel layer is electrically insulated from the lower dummy epitaxial layer.

20. The vertical-type memory device as claimed in claim 17, further comprising a cell channel layer in a channel hole passing through the plurality of gate electrode layers, wherein a lower end of the at least one dummy channel layer is closer to the substrate than a lower end of the cell channel layer.

* * * * *